United States Patent
Bang et al.

(10) Patent No.: US 9,226,408 B2
(45) Date of Patent: Dec. 29, 2015

(54) DISPLAY DEVICE

(71) Applicant: LG Display Co., Ltd., Seoul (KR)

(72) Inventors: Jinyoung Bang, Gumi-si (KR); Doheon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/956,102

(22) Filed: Jul. 31, 2013

(65) Prior Publication Data

US 2014/0239317 A1      Aug. 28, 2014

(30) Foreign Application Priority Data

Feb. 27, 2013   (KR) .................. 10-2013-0020994

(51) Int. Cl.
| | |
|---|---|
| *G02F 1/1345* | (2006.01) |
| *H05K 3/36* | (2006.01) |
| *H05K 1/14* | (2006.01) |
| *H05K 1/11* | (2006.01) |
| *H05K 1/18* | (2006.01) |

(52) U.S. Cl.
CPC ............. *H05K 3/361* (2013.01); *H05K 1/147* (2013.01); *G02F 1/13452* (2013.01); *H01L 2924/0002* (2013.01); *H05K 1/118* (2013.01); *H05K 1/189* (2013.01); *H05K 2201/09481* (2013.01); *H05K 2201/10128* (2013.01)

(58) Field of Classification Search
CPC .......... G02F 1/133305; G02F 1/13306; G02F 1/1336; G09G 2300/0404; G09G 2300/0439; G09G 2300/08; G09G 3/3233; G09G 3/3291; H01L 27/3244
See application file for complete search history.

(56) References Cited

U.S. PATENT DOCUMENTS

| | | | |
|---|---|---|---|
| 4,690,510 A | 9/1987 | Takamatsu et al. | |
| 5,670,994 A * | 9/1997 | Kawaguchi et al. | 345/206 |
| 8,890,408 B2 | 11/2014 | Maatta | |
| 2002/0017859 A1* | 2/2002 | Ishikawa et al. | 313/504 |
| 2002/0117328 A1 | 8/2002 | Oishi et al. | |
| 2007/0076159 A1* | 4/2007 | Lee et al. | 349/149 |
| 2012/0256896 A1* | 10/2012 | Yamazaki | G02F 1/13318 345/211 |
| 2013/0002572 A1 | 1/2013 | Jin et al. | |

FOREIGN PATENT DOCUMENTS

| | | |
|---|---|---|
| EP | 1 044 445 B1 | 11/2005 |
| JP | H06-230728 A | 8/1994 |
| JP | H06-231814 A | 8/1994 |
| JP | 2001-296544 A | 10/2001 |
| JP | 2002-258310 A | 9/2002 |

OTHER PUBLICATIONS

European Patent Office, Search Report and Written Opinion, European Patent Application No. 13189060.0, Mar. 2, 2015, eight pages.

* cited by examiner

*Primary Examiner* — David Vu
*Assistant Examiner* — Cuong Nguyen
(74) *Attorney, Agent, or Firm* — Fenwick & West LLP

(57) ABSTRACT

A display device includes a substrate and a flexible circuit having one of its ends bonded to the substrate. The substrate comprises a pixel array. A driver integrated circuit (IC) is mounted on the flexible circuit. The flexible circuit is bonded to the substrate without protruding beyond an edge of the substrate. One end of the flexible circuit faces toward an inside of the substrate when the flexible circuit is flatly placed on or over the substrate, and the other end of the flexible circuit is bonded to the edge of the substrate.

20 Claims, 28 Drawing Sheets

DISPLAY DEVICE

CROSS-REFERENCE TO RELATED APPLICATION

This application claims the benefit of Korean Patent Application No. 10-2013-0020994 filed on Feb. 27, 2013, the entire contents of which is incorporated herein by reference for all purposes as if fully set forth herein.

BACKGROUND OF THE INVENTION

1. Field of the Invention

Embodiments of the invention relate to a structure for mounting a flexible circuit for transmitting scan signals or data signals in a display device.

2. Discussion of the Related Art

Various flat panel displays such as a liquid crystal display (LCD), a plasma display panel (PDP), an organic light emitting display, a field emission display (FED), and an electrophoresis display (EPD) have been developed.

Driver integrated circuits (ICs) of the flat panel display are mounted on a display panel and are connected to data lines (or signal lines) or scan lines (or gate lines). A source driver IC supplies a data signal to the data lines, and a gate driver IC sequentially supplies a scan signal (or a gate pulse) synchronized with the data signal to the scan lines.

To mount the driver ICs on the display panel, a method for bonding a flexible circuit means mounting the driver ICs to the display panel, a chip-on glass (COG) method for directly bonding the driver ICs to a substrate of the display panel, etc. are well known. Examples of the flexible circuit means used to mount the driver ICs include a chip-on film (COF) and a tape carrier package (TCP). In the following description, the COF is used as an example of the flexible circuit means. The flexible circuit means, on which the driver ICs are mounted, is bonded to the substrate of the display panel using an anisotropic conductive film (ACF).

As shown in FIGS. 1 and 2, source COFs 6 and gate COFs 8 are connected to a substrate 2 of a display panel. A source driver IC 5 is mounted on each of the source COFs 6. Output terminals of the source COFs 6 are bonded to the substrate 2 of the display panel, so that they are connected to data lines of the display panel. Input terminals of the source COFs 6 are connected to a source printed circuit board (PCB) 4. A gate driver IC 7 is mounted on each of the gate COFs 8. The gate COFs 8 are bonded to the substrate 2 of the display panel, so that they are connected to gate lines of the display panel. The gated COFs 8 are also bonded to and to a gate PCB (not shown).

When the COFs 6 and 8 are bonded to the substrate 2 of the display panel in a forward direction, the COFs 6 and 8 partially protrude beyond the substrate 2 of the display panel. A method for bonding the COFs 6 and 8 in the forward direction is to bond one end of each of the COFs 6 and 8 to an edge of the substrate 2 of the display panel so that the other end of each of the COFs 6 and 8 faces toward the outside of the substrate 2 of the display panel. Because the COFs 6 and 8 are flexible, the COFs 6 and 8 may be bent as shown in FIG. 2. Examples of the method for bonding the flexible circuit means mounting the driver ICs to the substrate of the display panel in the forward direction to partially protrude the driver ICs to the outside of the substrate are disclosed in Japanese Patent Publication No. Hei 6-231814 (publication date: Aug. 19, 1994), Japanese Patent Publication No. 2003-186044 (publication date: Jul. 3, 2003), U.S. Patent Application Publication No. 2002/0180686A1 (publication date: Dec. 5, 2002), and U.S. Patent Application Publication No. 2004/0169645A1 (Sep. 2, 2004), which are hereby incorporated by reference in their entirety.

After bonding the COFs 6, 8 to the substrate 2 of the display panel, the COFs 6, 8 are bonded to the source PCB 4 or the gate PCB. For this purpose, the COFs 6, 8 are flattened as shown in FIG. 1. Then a bonding tool (not shown) applies heat and pressure to the ends of the COFs 6, 8 not attached to the substrate 2 of the display panel. Because the bonding tool operates to apply heat at the left side or bottom part of FIG. 1 at locations away from the substrate 2, the substrate 2 is not affected by the heat generated by the bonding tool. After the COFs 6, 8 are bonded to the source PCB 4 or the gate PCB, the COFs 6, 8 are flipped over the substrate 2 (the flipping of COF 8 is illustrated in FIG. 2).

As a result flipping the COFs 6, 8 over the substrate 2, the COFs 6 and 8 partially protrude beyond the substrate 2 of the display panel as shown in FIG. 2. As shown in FIG. 2, the portions of the COFs 8 overlap across length OL. Thus, even if the substrate 2 of the display panel does not have a bezel area, a bezel of a display device may not be reduced to the size equal to or less than a protrusion width of the flexible circuit means. Further, the edges of the display panel have to be rounded because of the problem of the design. However, as shown in FIGS. 1 and 2, because a grinder interferes with the gate COFs 8, it is difficult to round a portion of edges 2a and 2b of the substrate 2 of the display panel. Thus, when the COFs 6 and 8 protrude to the outside of the substrate 2 of the display panel, a bezel width of the display device increases and it is difficult to round the edges of the substrate 2 of the display panel.

SUMMARY OF THE INVENTION

Embodiments relate to a display device including a substrate and a flexible circuit having one of its ends bonded to the substrate. The substrate comprises a pixel array. A driver integrated circuit (IC) is mounted on the flexible circuit. The flexible circuit is bonded to the substrate without protruding beyond an edge of the substrate. One end of the flexible circuit faces toward an inside of the substrate when the flexible circuit is flatly placed on or over the substrate, and the other end of the flexible circuit is bonded to the edge of the substrate.

The substrate further comprises data pads connected to data lines of the pixel array, and scan pads connected to scan lines of the pixel array.

In one embodiment, the flexible circuit comprises at least one of a source flexible circuit connecting a source driver IC to the data pads, and a scan flexible circuit connecting a scan driver IC to the scan pads.

In one embodiment, the other end of the flexible circuit is separated from the edge of the substrate by a distance equal to or greater than 0.3 mm.

In one embodiment, the flexible circuit is one of a chip-on film (COF) and a tape carrier package (TCP).

In one embodiment, a plurality of driver ICs are mounted on the flexible circuit.

In one embodiment, the display device further includes a gate printed circuit board bonded to the other end of the flexible circuit to supply scan signals to scan lines formed in the pixel array; line-on glass (LOG) lines directly formed on the substrate and connected to the flexible circuit; and a source printed circuit board connected to the LOG lines.

In one embodiment, the display device further includes a control board configured to output digital video data of an input image, a source timing control signal for controlling operation timing of the source driver IC, a gate timing control signal for controlling operation timing of the gate driver IC, a gate high voltage and a gate low voltage of the scan signal, and a pixel power voltage applied to pixels of the pixel array, the control board connected to the source printed circuit board through the flexible circuit.

In one embodiment, a plurality of gate driver ICs are mounted on the flexible circuit. The gate high voltage, the gate low voltage, and the pixel power voltage are supplied in series or in parallel to each of the plurality of gate driver ICs through input terminals formed on the flexible circuit.

In one embodiment, the display device further includes an insulating material between the substrate and the flexible circuit. The insulating material is formed with a groove for receiving the driver IC.

Embodiments also relate to a method of manufacturing a display device includes bonding the flexible circuit to the substrate formed with a pixel array without protruding beyond an edge of the substrate. One end of the flexible circuit faces toward an inside of the substrate when the flexible circuit is flatly placed on or over the substrate, and the other end of the flexible circuit is bonded to the edge of the substrate.

In one embodiment, the bonding the flexible circuit to the substrate includes bonding the other end of a flexible circuit to the edge of the substrate with the one end of the flexible circuit at an opposite side of the other end placed at an initial location; moving the one end of the flexible circuit from the initial location to a bonding location via a predetermined path; bonding the one end of the flexible circuit to a printed circuit board at the bonding location; and releasing the one end of the flexible circuit from the bonding location.

In one embodiment, the bonding location is located beyond the edge of the substrate by a predetermined distance.

In one embodiment, the other end of the flexible circuit is bonded to the edge of the substrate by applying heat and pressure to the other end of the flexible circuit or the edge of the substrate, and the one end of the flexible circuit is bonded to the printed circuit board by applying heat and pressure to the one end of the flexible circuit or the printed circuit board.

In one embodiment, the bonding the flexible circuit to the substrate includes bonding the one end of the flexible circuit to a printed circuit board; placing the other end of the flexible circuit at the edge of the substrate; and bonding the other end of the flexible circuit to the edge of the substrate.

In one embodiment, the printed circuit board is placed on or above the substrate when bonding the other end of the flexible circuit to the substrate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead understanding of the embodiments.

Figure 1:
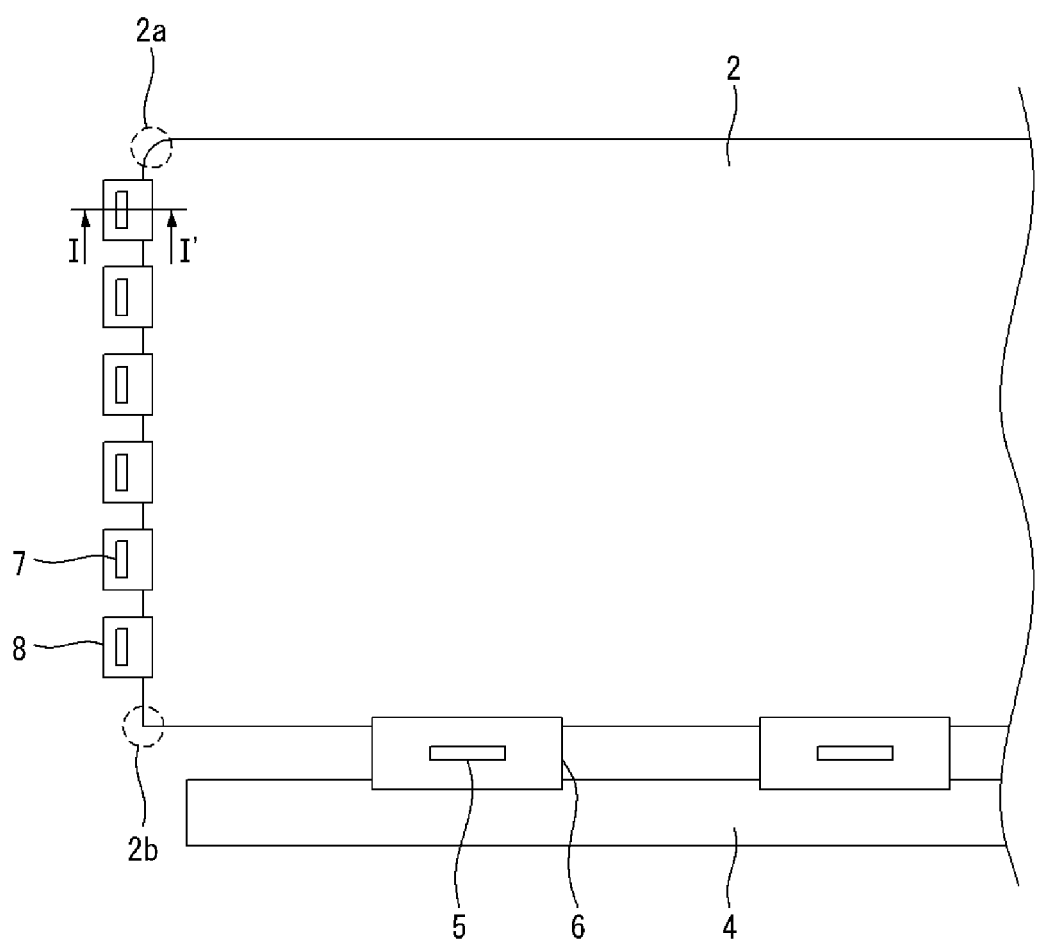
FIG. 1 illustrates a display panel bonded to a flexible printed circuit board that mounts driver integrated circuits (ICs).
Figure 2:
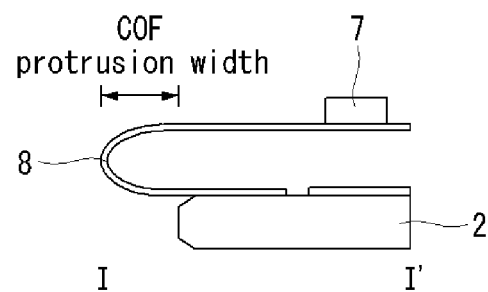
FIG. 2 is a cross-sectional view taken along line I-I' of FIG. 1.
Figure 3:
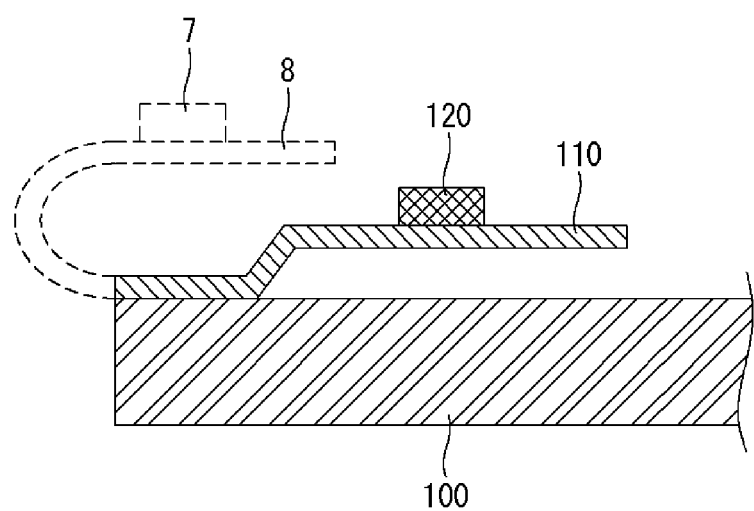
FIG. 3 is a cross-sectional view illustrating bonding of a flexible circuit means of a display device, according to an embodiment.

As shown in FIG. 3, a display device according to an exemplary embodiment of the invention includes a flexible circuit means 110 bonded to a substrate 100 of a display panel in a direction reverse to what is shown in FIGS. 1 and 2. Driver integrated circuits (ICs) 120 are mounted on the flexible circuit means 110. The driver IC 120 may be a source driver IC or a gate driver IC. The flexible circuit means 110 may be a chip-on film (COF) or a tape carrier package (TCP). Hereinafter, the embodiment of the invention is described using the COF as an example of the flexible circuit means, but is not limited thereto. In the embodiment of the invention, the COF 110 is bonded to the substrate 100 of the display panel in the reverse direction. As a result, one end 20b (refer to FIG. 6) of the COF 110 is face toward the inside of the substrate 100 of the display panel when the flexible circuit is flatly placed on or over the substrate. Furthermore, both end of the COF 110 face the substrate 100 as shown in FIGS. 3-6. The other end 20a (refer to FIG. 6) of the COF 110 to an edge of the substrate 100 of the display panel. The other end 20a of the COF 110 bonded to the substrate 100 of the display panel faces toward the outside of the display panel. The driver IC 120 is mounted between the one end 20b and the other end 20a of the COF 110. As described above, when the COF 110 is bonded to the substrate 100 of the display panel in the reverse direction, the COF 110 is positioned inside the substrate 100 of the display panel. Therefore, the COF 110 does not protrude beyond the edge of the substrate 100 of the display panel. Further, the COF 110 is not flipped over and is remains relatively flat with respect to the surface of the substrate 100 of the display panel. The flipping over of the COF 110 herein refers to bending the COF 110 so that a surface facing one direction at one end of the COF 110 is bent so that the same surface faces the other direction at the other end of the COF 110 (i.e. the COF 110 is bent 180 degrees).

It is to be noted that the COF 110 does not have any portions that overlap with other portions of the COF 110.

Forward direction bonding method of FIGS. 1 and 2 for bonding one end of a COF facing toward the inside of a substrate of a display panel to the substrate of the display panel in a state where the other end of the COF faces toward the outside of the substrate of the display panel, thereby bonding the COF to the display panel. Thus, in the bonding method of FIGS. 1 and 2, the other end of the COF not bonded to the display panel protrudes beyond the edge of the display panel.

The other end 20a of the COF 110 is bonded to the edge of the substrate 100 of the display panel. The other end 20a of the COF 110 bonded to the substrate 100 of the display panel faces towards outside of the display panel but not beyond the edges of the display pane.

Figure 8:
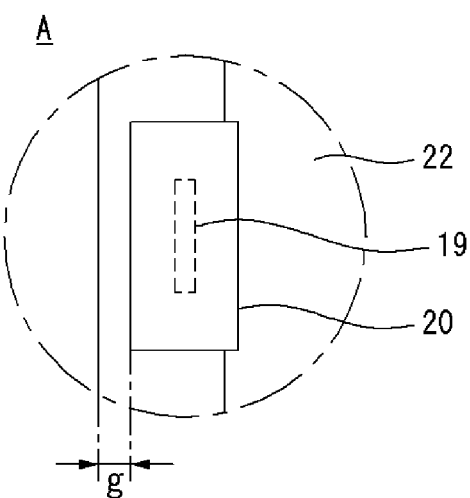
FIG. 8 is an enlarged view of a portion "A" shown in FIG. 4 where a separation distance exists between a gate COF and a side surface of a substrate of a display panel when the gate COF is bonded to the substrate of the display panel in a reverse direction.
Figure 11:
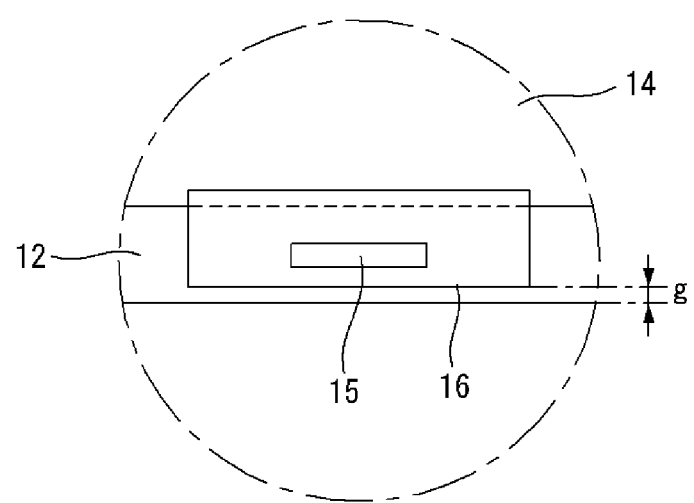
FIG. 11 is an enlarged view of a portion 'B' shown in FIG. 10 where a separation distance exists between a source COF and a side surface of a substrate of a display panel when the source COF is bonded to the substrate of the display panel in a reverse direction.

The other end 20a of the COF 110 may be bonded to the substrate 100, so that the other end 20a of the COF 110 substantially aligns with the edge of the substrate 100 of the display panel. Alternatively, as shown in FIGS. 8 and 11, the other end 20a of the COF 110 may be separated away inwards from the edge of the substrate 100 of the display panel by a predetermined design margin 'g' and may be bonded to the substrate 100. In FIG. 3, the dotted line indicates the forward direction bonding method of the COF, and the solid line indicates the reverse direction bonding method of the COF.

The COF 110 is bonded to the substrate 100 of the display panel in a flat manner. Thus, the embodiment of the invention may prevent a stress or a crack generated when the COF 110 is excessively bent. In the structure as shown in FIG. 2, because the COF is bent at an angle equal to or greater than 90°, a crack may occur in a bending portion of the COF.

As shown in FIG. 3, the embodiment of the invention may reduce the bezel width of the display device by bonding the COF 110 to the substrate 100 in the reverse direction so that the COF 110 does not protrude beyond the edges of the substrate 100, thereby achieving a thin profile of the display device. Further, in the embodiment of the invention, because the COF 110 does not protrude beyond the edges of the substrate 100, a grinder does not interfere with the edge of the substrate 100 of the display panel. Therefore, each of the four edges of the substrate 110 may be easily rounded.

The display device according to the embodiment of the invention may be applied to any display device, which requires bonding of the flexible circuit means mounted with the driver ICs to the substrate of the display panel. Hereinafter, the embodiment of the invention is described using an organic light emitting display as an example of the display device, but is not limited thereto.

FIGS. 4 through 11 illustrate an organic light emitting display according to an embodiment of the invention. As shown in FIGS. 4 through 11, an organic light emitting display includes source COFs 16 bonded to a substrate 12 of a display panel and gate COFs 20 bonded to the substrate 12.

A source driver IC 15 for supplying a data signal to data lines of the display panel is mounted on each of the source COFs 16. A gate driver IC 19 for sequentially supplying a scan signal synchronized with the data signal to scan lines of the display panel is mounted on each of the gate COFs 20. The scan signal may be generated as a pulse swinging between a gate high voltage VGH and a gate low voltage VGL.

Figure 6:
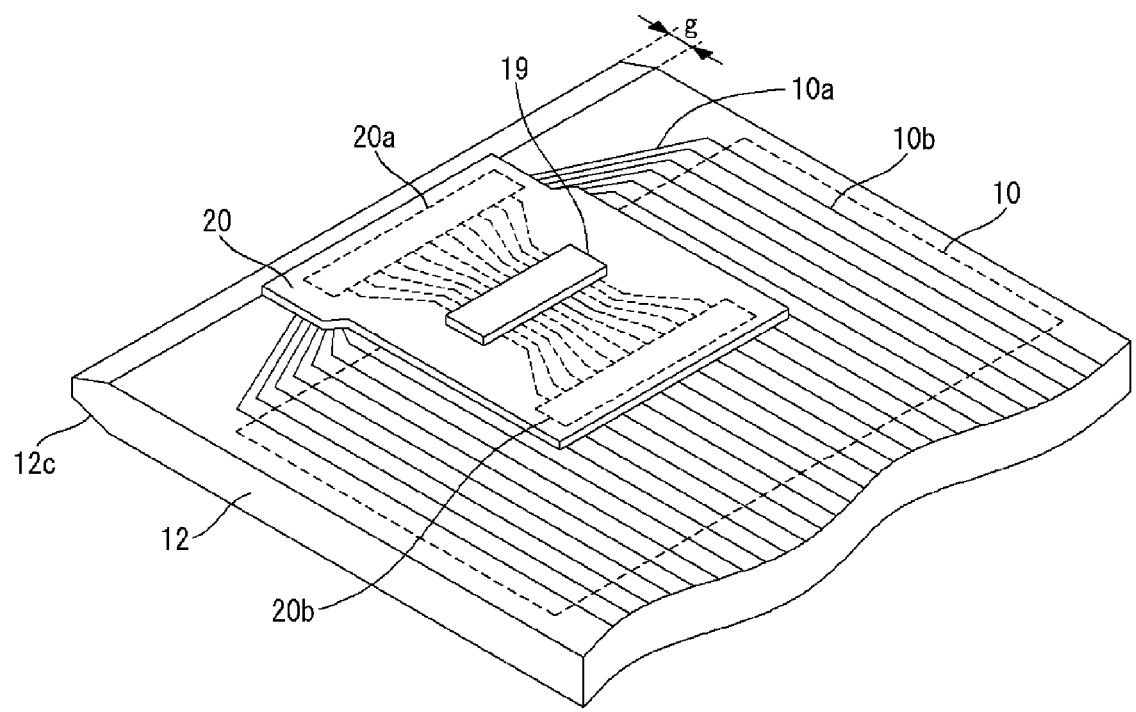
FIG. 6 is a perspective view of a chip-on film (COF) bonded to a substrate of a display panel, according to an embodiment.

As shown in FIG. 6, a pixel array 10 for generating an input image may be formed on a back surface of the substrate 12 of the display panel. Data pads (not shown) for connecting the data lines of the pixel array 10 to the source COFs 16 and scan pads (not shown) for connecting the scan lines of the pixel array 10 to the gate COFs 20 are formed on the back surface of the substrate 12 of the display panel. Data link lines (not shown) are formed between the data lines and the data pads. Output terminals of the source COFs 16 are bonded to the data pads through an anisotropic conductive film (ACF). Because a pitch between the output terminals of the source COFs 16 is less than a pitch between the data lines, a pitch of the data link lines decreases as the data link lines are close to the data pads. Scan link lines 10a (refer to FIG. 6) are formed between the scan lines 10b (refer to FIG. 6) and the scan pads in the same manner as the data link lines. Output terminals of the gate COFs 20 are bonded to the scan pads through an ACF. Because a pitch between the output terminals of the gate COFs 20 is less than a pitch between the scan lines, a pitch of the scan link lines decreases as the scan link lines get closer to the scan pads.

As shown in FIG. 6, the COFs 16 and 20 extend over the pixel array 10 away from the edge of the substrate 12 without flipping of the COFs 16 and 20.

If an organic compound of the pixel array 10 is exposed to moisture or oxygen, the pixel array 10 may be degraded. An encapsulation member 28 may be bonded to the back surface of the substrate 12 and may seal the pixel array 10 so as to prevent the degradation of the pixels. The encapsulation member 28 may be a metal encapsulation substrate or a glass encapsulation substrate. A polarizing film 12a may be attached to a front surface of the substrate 12.

Figure 5:
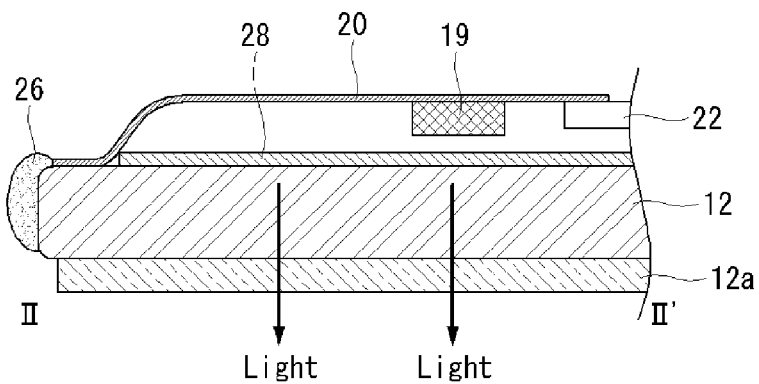
FIG. 5 is a cross-sectional view taken along line II-II' of FIG. 4, according to an embodiment.

As shown in FIG. 5, a side seal 26 may be applied to the side of the substrate 12 of the display panel so as to prevent a light leakage resulting from the emission of light from the pixel array 10 through the side of the pixel array 10 from being generated. The side seal 26 may be manufactured using a polymer material, to which a black pigment is added. The side seal 26 absorbs light emitted from the pixel array 10. The light emitted through the side of the pixel array 10 is not seen by the side seal 26.

Figure 4:
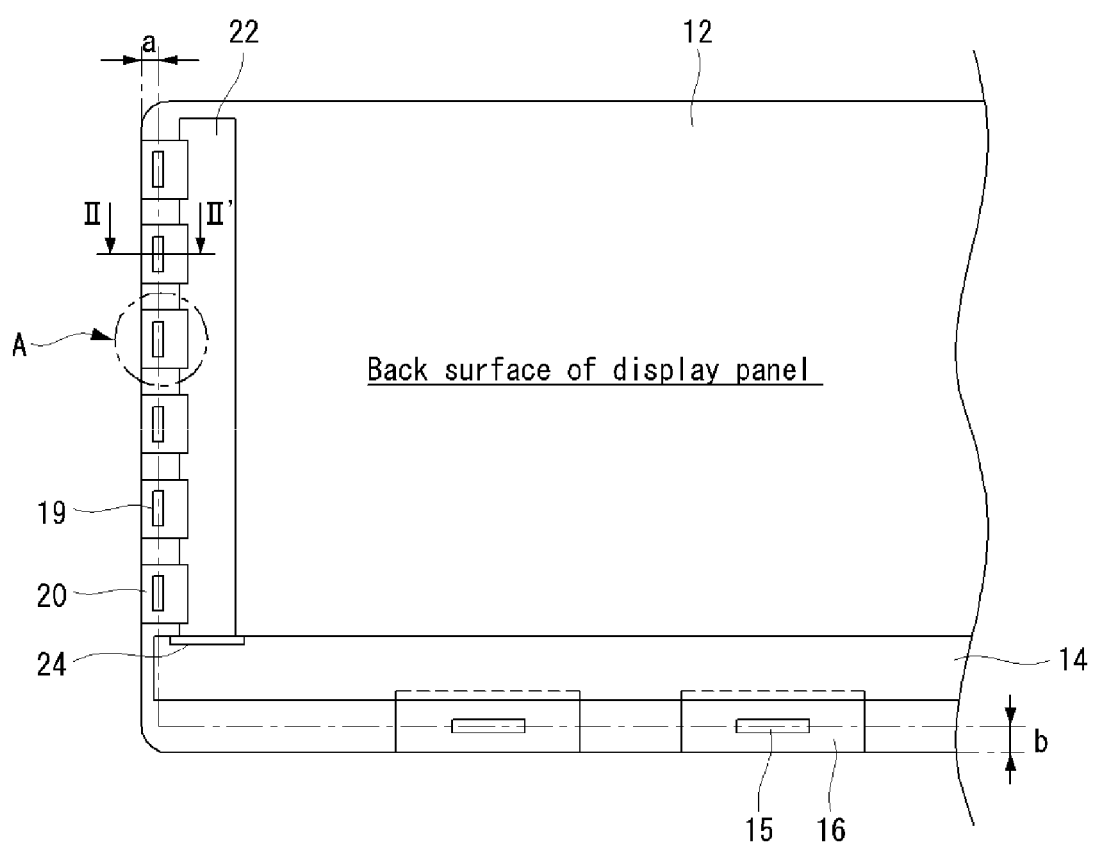
FIG. 4 is a plan view of a back surface of an organic light emitting display according to an embodiment.
Figure 10:
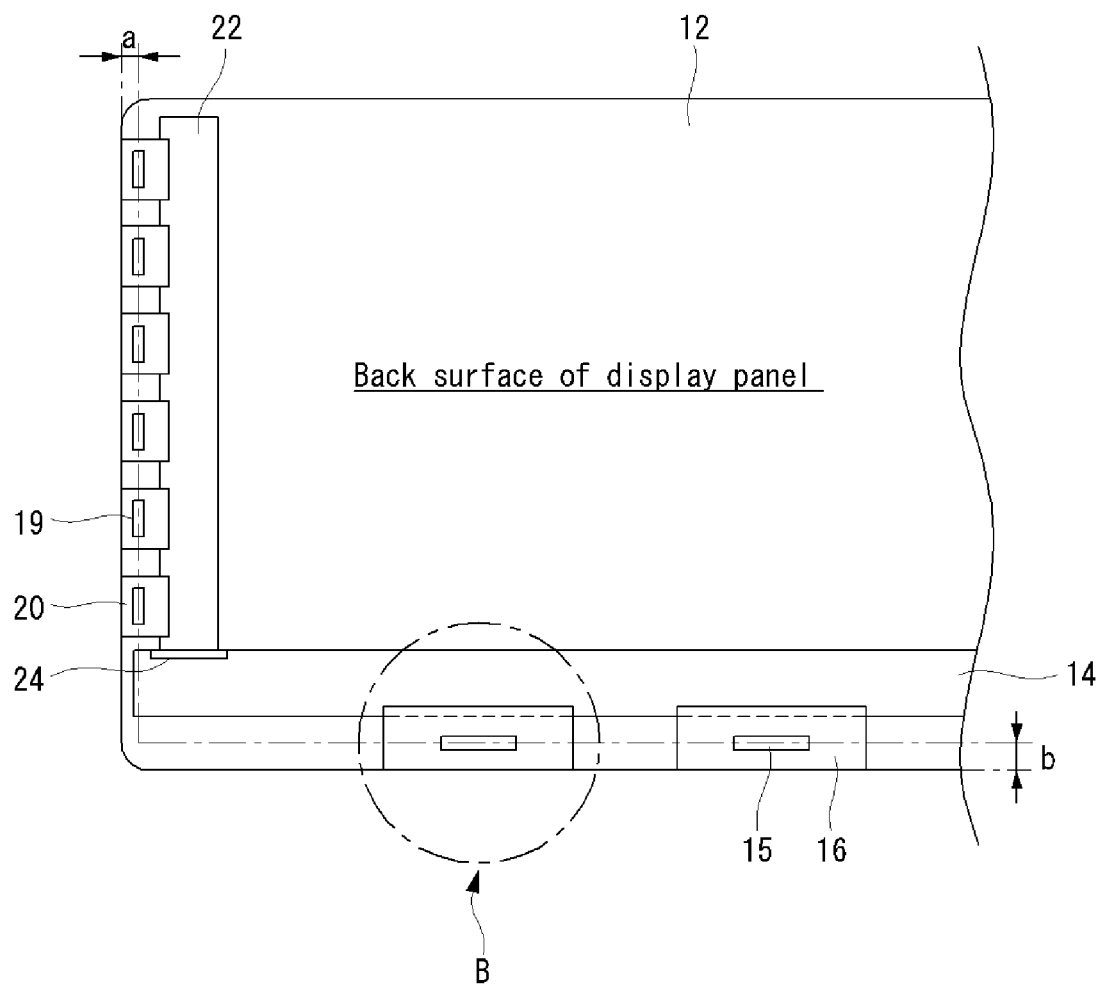
FIG. 10 is a plan view illustrating bonding a source COF to a substrate of a display panel in a reverse direction, according to an embodiment.

At least one of the source COF 16 and the gate COF 20 is bonded to an edge of the back surface of the substrate 12 of the display panel in a reverse direction. As shown in FIG. 4, when the gate COFs 20 are bonded in the reverse direction and the source COFs 16 are bonded in the forward direction, the gate COFs 20 do not protrude to the outside of the substrate 12 of the display panel. On the other hand, the source COFs 16 may protrude to the outside of the substrate 12 of the display panel. In this instance, a bezel width 'a' of each of a left end and a right end of the display panel may be reduced. As shown in FIG. 10, the source COFs 16 may be bonded to the substrate 12 of the display panel in the reverse direction so that a bezel width 'b' of a lower part of the display panel is reduced to the bezel width 'a' of the left end of the display panel.

An input terminal of the COF 16 formed at the one end 20b (refer to FIG. 6) of each of the source COFs 16 may be connected to a source PCB 14, and an output terminal of the COF 16 formed at the other end 20a (refer to FIG. 6) of each of the source COFs 16 may be bonded to the data pads formed on the substrate 12 of the display panel. Further, an input terminal of the COF 20 formed at the one end 20b (refer to FIG. 6) of each of the gate COFs 20 may be connected to a gate PCB 22, and an output terminal of the COF 20 formed at the other end 20a (refer to FIG. 6) of each of the gate COFs 20 may be bonded to the gate pads formed on the substrate 12 of the display panel. The input terminals formed at the one ends 20b (refer to FIG. 6) of the gate COFs 20 are not connected to the gate PCB 22 and may be connected to line-on glass (LOG) lines 11 (refer to FIG. 14) directly formed on the substrate 12 of the display panel. The gate PCB 22 may be connected to the source PCB 14 through a connector 24. The gate PCB 22 may be implemented as a flexible PCB capable of being bent.

Figure 7A:
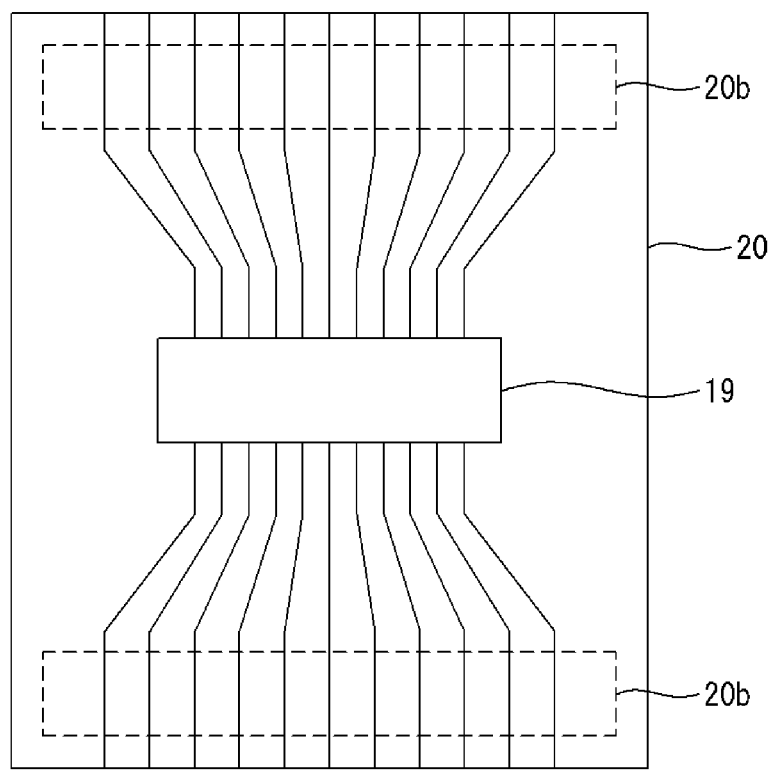
FIGS. 7A and 7B are plan views illustrating various examples of COFs according to embodiments.
Figure 7B:
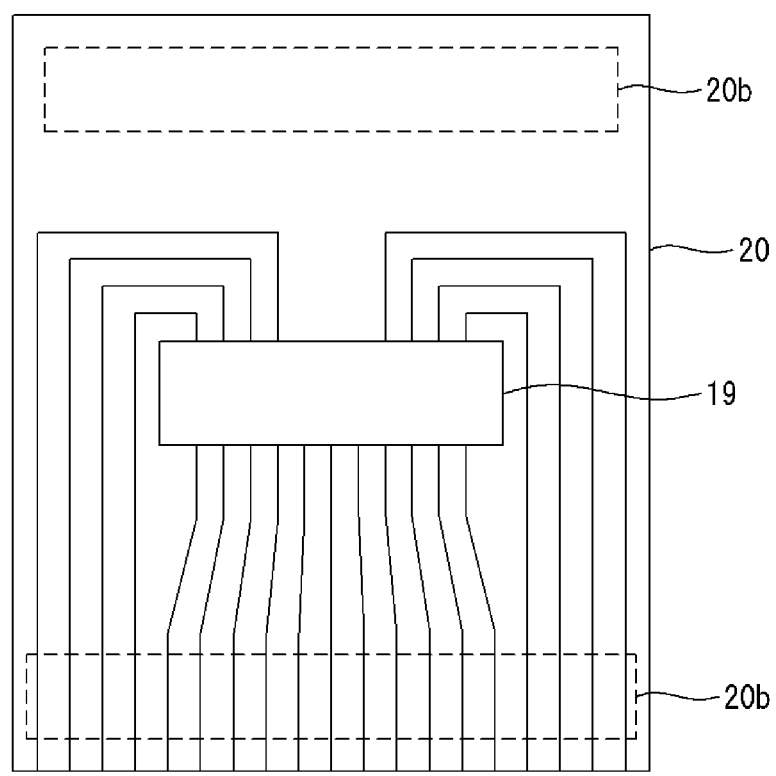

FIGS. 7A and 7B are plan views illustrating various examples of the COFs 16 and 20, according to embodiments.

The driver ICs 15 and 19 are mounted on the COFs 16 and 20. As shown in FIG. 7A, the input terminals may be formed at the one ends 20b of the COFs 16 and 20, and the output terminals may be formed at the other ends 20a of the COFs 16 and 20. Alternatively, as shown in FIG. 7B, the input terminals and the output terminals may be formed at the one ends 20b of the COFs 16 and 20. The COFs 16 and 20 shown in FIG. 7B receive electric power and a timing control signal through the LOG lines 11 formed on the substrate 12 and output signals to the data lines or the gate lines formed on the substrate 12. Therefore, the COFs 16 and 20 shown in FIG. 7B are bonded to only the substrate 12 and are not bonded to the PCB.

FIG. 8 is an enlarged view of a portion 'A' shown in FIG. 4 where a separation distance 'g' exists between the gate COF 20 and a side surface of the substrate 12 of the display panel when the gate COF 20 is bonded to the substrate 12 of the display panel in the reverse direction. FIG. 11 is an enlarged view of a portion 'B' shown in FIG. 10 where a separation distance 'g' exists between the source COF 16 and a side surface of the substrate 12 of the display panel when the source COF 16 is bonded to the substrate 12 of the display panel in the reverse direction.

An inclined chipping surface 12c shown in FIG. 6 may be formed at the edge of the substrate 12. It is preferable, but not required, that the separation distance 'g' between the other end 20a of the COFs 16 and 20 bonded to the substrate 12 and edge of the substrate 12 is set to be equal to or greater than about 0.3 mm in consideration of a width of the chipping surface 12c of the substrate 12, a thermal expansion degree of the COF, a process margin, etc.

Figure 9:
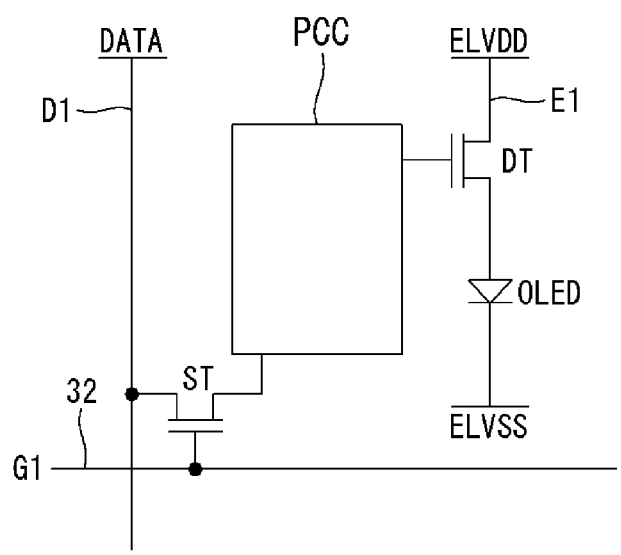
FIG. 9 is an equivalent circuit diagram illustrating an example of a pixel formed on a display panel, according to an embodiment.

FIG. 9 is an equivalent circuit diagram illustrating an example of a pixel formed on the display panel. As shown in FIG. 9, a pixel PIX includes a switch thin film transistor (TFT) ST, a compensation circuit PCC, a driving TFT DT, an organic light emitting diode OLED, etc. The switch TFT ST switches on a current path between a data line D1 and the compensation circuit PCC in response to a scan pulse from a scan line G1 and supplies a data signal to the compensation circuit PCC. The compensation circuit PCC includes at least one switch TFT and at least one capacitor. The compensation circuit PCC initializes a gate of the driving TFT DT, senses a threshold voltage of the driving TFT DT, and adds the threshold voltage of the driving TFT DT to a voltage of the data signal, thereby compensating for variations in the data signal. The compensation circuit PCC may use any known pixel compensation circuit of an organic light emitting display. The driving TFT DT is connected between a high potential power voltage line, to which a pixel power voltage ELVDD is supplied, and the organic light emitting diode OLED. The driving TFT DT adjusts a current flowing in the organic light emitting diode OLED based on the data voltage applied to the gate of the driving TFT DT. The pixel power voltage ELVDD is commonly applied to the pixels PIX of the pixel array. The organic light emitting diode OLED includes an organic compound, in which a hole injection layer, a hole transport layer, a light emitting layer, an electron transport layer, an electron injection layer, etc. are stacked.

The pixels PIX may be formed on the back surface of the substrate 12 of the display panel. When the organic light emitting diodes OLED of the pixels PIX emit light, the light is irradiated onto the front of the display panel through the substrate 12 as shown in FIG. 5. The OLED operating in this manner is known as a bottom emission type organic light emitting display.

Figure 12:
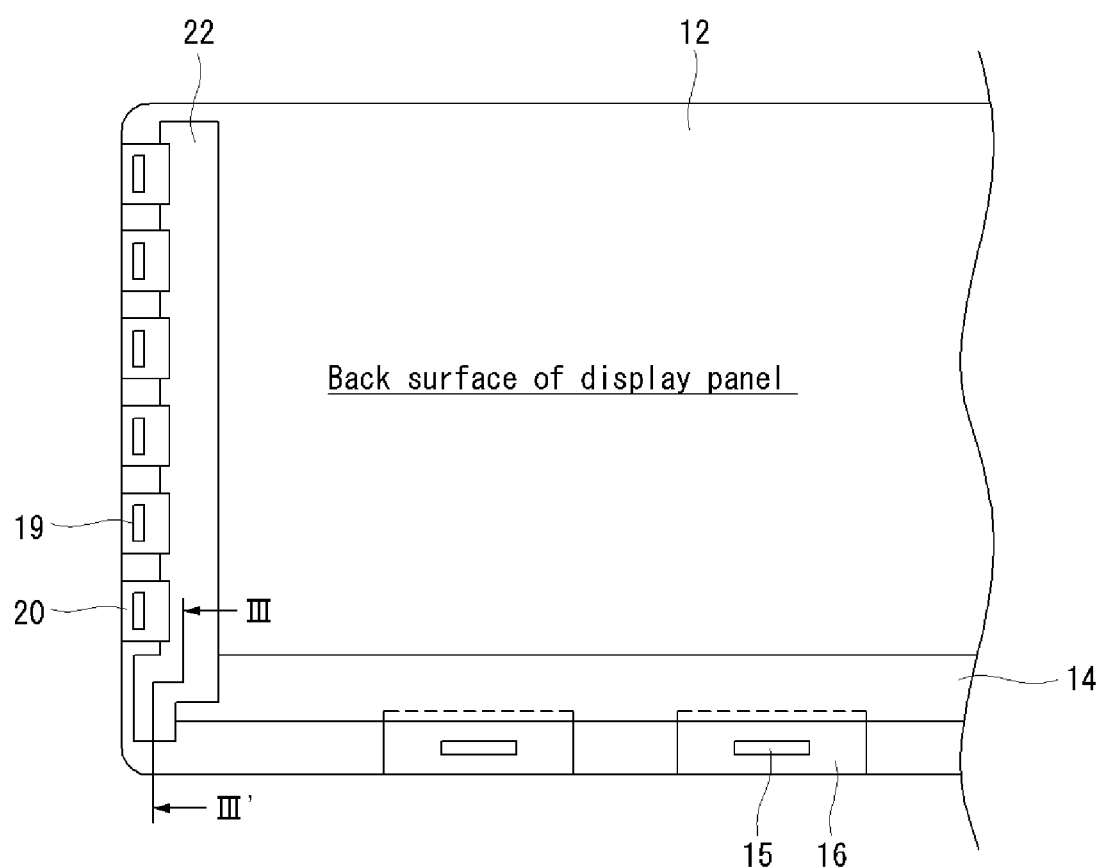
FIG. 12 is a plan view illustrating an example of connecting a flexible circuit means manufactured as a gate printed circuit board (PCB) to a source printed circuit board, according to an embodiment.
Figure 13:
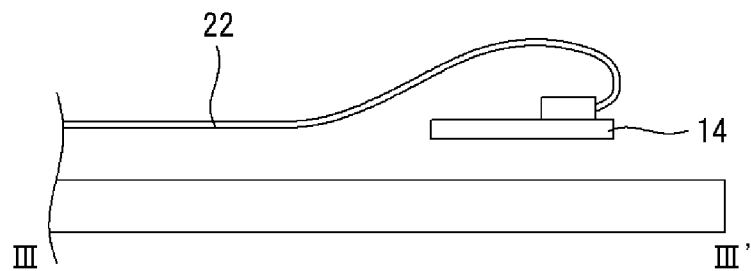
FIG. 13 is a cross-sectional view taken along line III-III' of FIG. 12, according to an embodiment.
Figure 14:
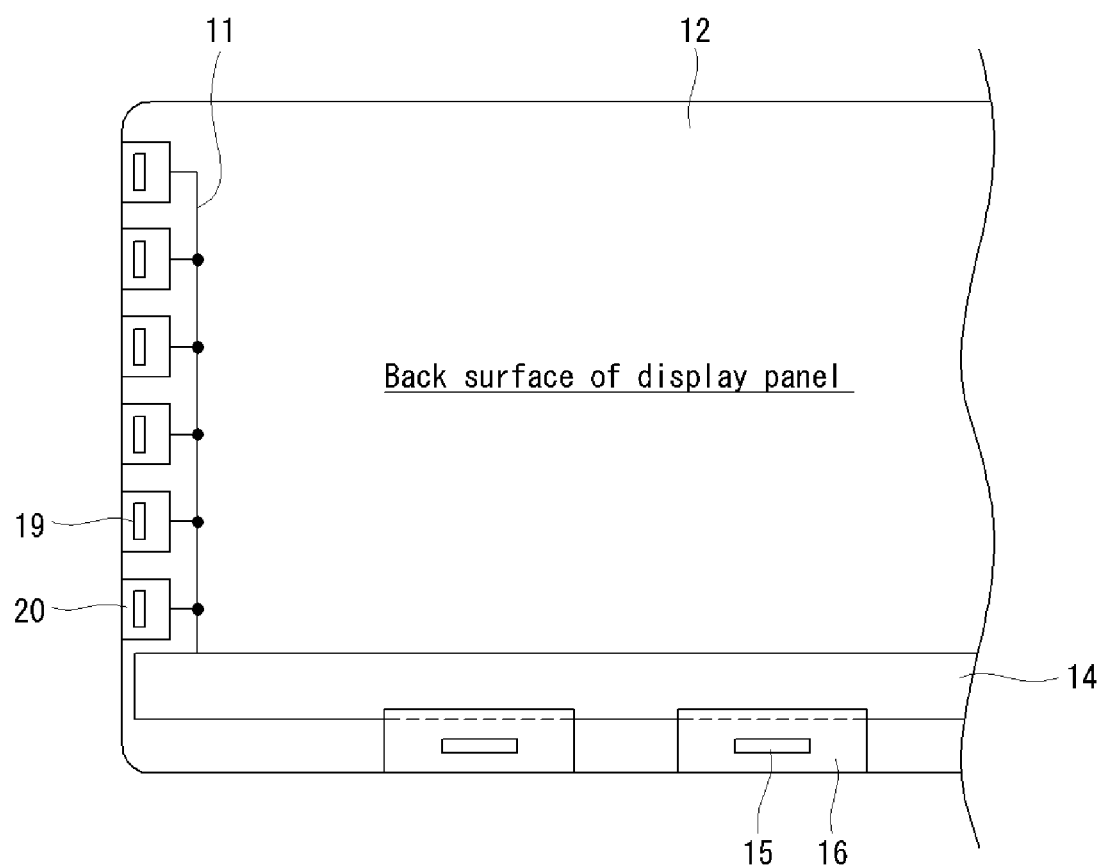
FIG. 14 is a plan view illustrating an example of connecting COFs to LOG lines, according to one embodiment.

The gate PCB 22 includes lines for supplying gate power voltages and gate timing control signals to drive the gate driver ICs 19. The gate power voltages include a gate high voltage VGH and a gate low voltage VGL. The gate power voltages and the gate timing control signals may be transmitted to the gate PCB 22 through the source PCB 14. For this purpose, the gate PCB 22 may be connected to the source PCB 14. A method for connecting the gate PCB 22 to the source PCB 14 may be implemented in various ways. For example, as shown in FIGS. 4 and 10, the gate PCB 22 may be connected to the source PCB 14 through a connector 26. Alternatively, as shown in FIGS. 12 and 13, the gate PCB 22 may be manufactured as a flexible PCB and may be connected to the source PCB 14 through a connector by passing one end of the flexible PCB to the rear of the source PCB 14. As shown in FIG. 14, the gate COFs 20 may be connected to the LOG lines 11 formed on the substrate 12 of the display panel without the PCB. Input terminals of the LOG lines 11 are connected to the source PCB 14, and the LOG lines 11 receive the gate power voltage and the gate timing control signals through the source PCB 14. The LOG lines 11 transmit the gate power voltage and the gate timing control signals to the gate COFs 20.

Figure 15:
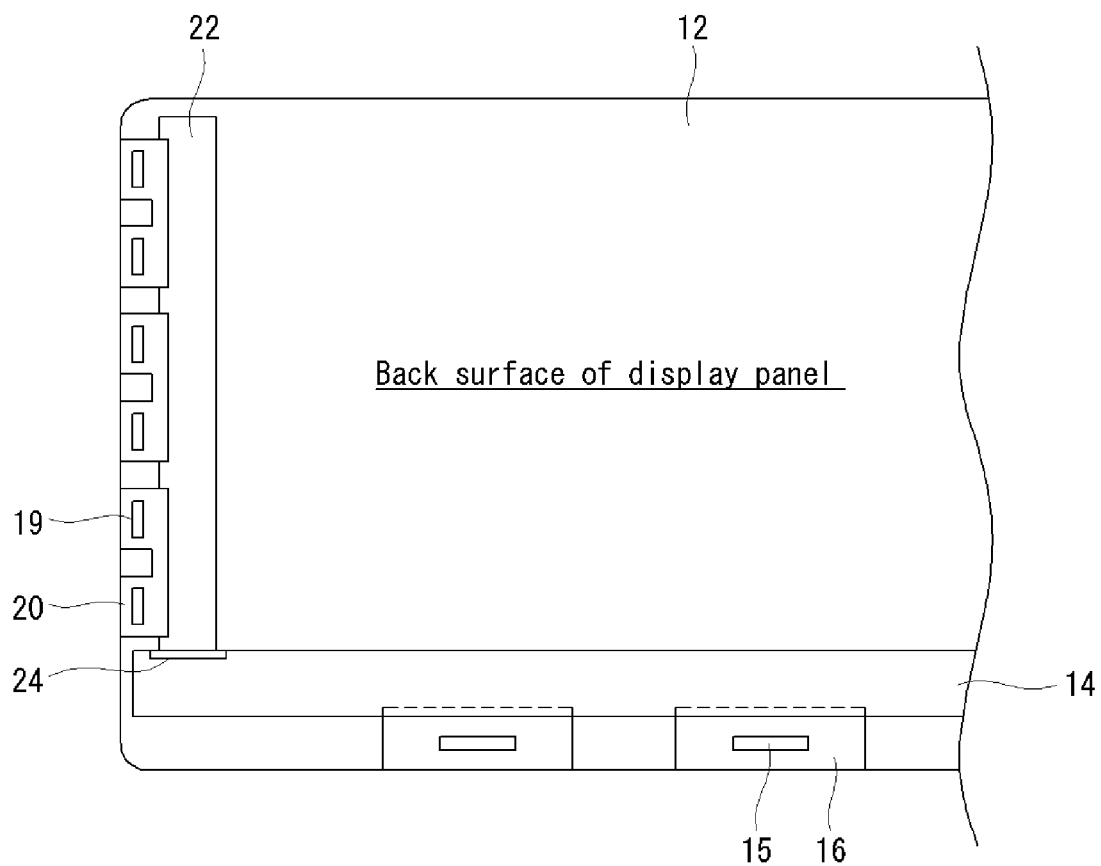
FIGS. 15 and 16 are plan views illustrating various examples of COFs, according to embodiments.
Figure 16:
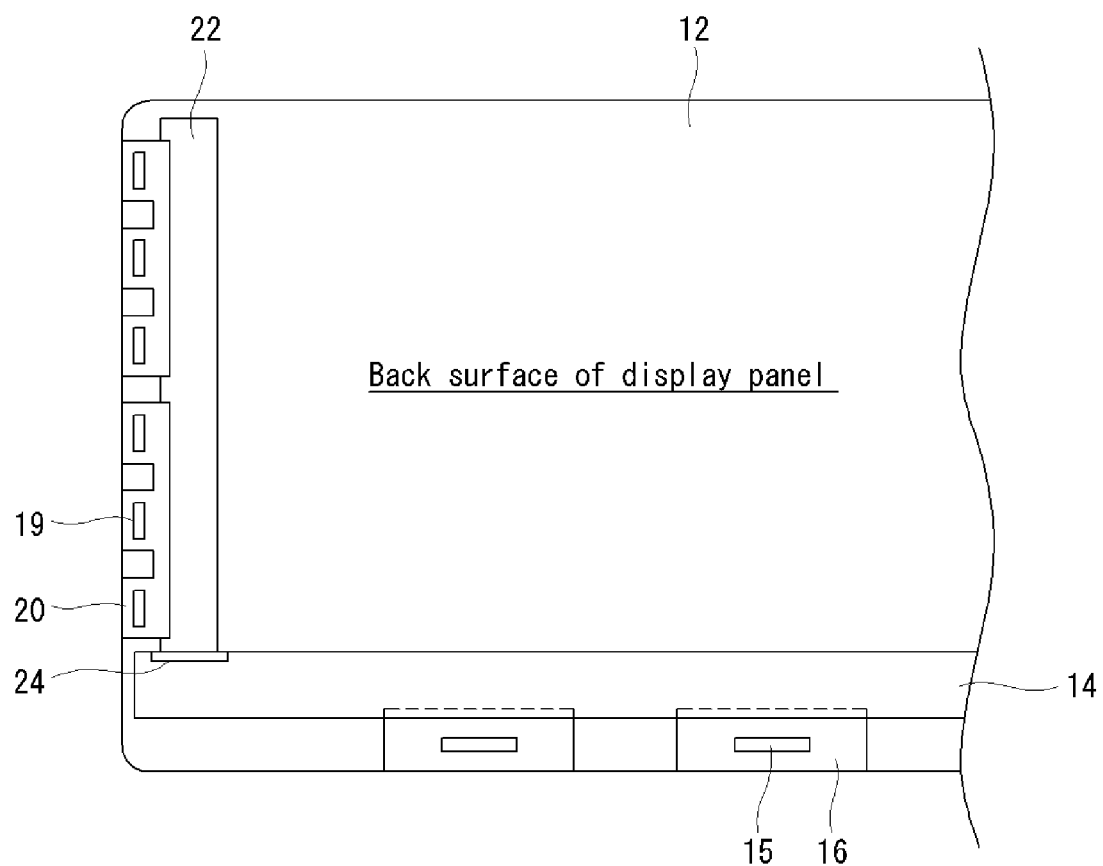

FIGS. 15 and 16 are plan views illustrating COF according to embodiments. As shown in FIGS. 15 and 16, the plurality of driver ICs 15 (or 19) may be mounted on one COF 16 (or 20). In the COF 16 (or 20) having the above-described structure, because the plurality of driver ICs 15 (or 19) are simultaneously bonded to the substrate 12 of the display panel, a bonding process time of the COF may be reduced.

The COFs 16 and 20 may be expanded because of heat generated in a bonding process of the COF. The COFs 16 and 20 and the substrate 12 may be misaligned because of the thermal expansion of the COFs 16 and 20. As shown in FIGS. 15 and 16, it is preferable, but not required, that the two or three driver ICs 15 (or 19) are mounted on one COF 16 (or 20). Further, as shown in FIGS. 15 and 16, the COF 16 (or 20) may include a slit having a predetermined cutting width between the driver ICs 15 (or 19), so as to reduce the thermal expansion of the COFs 16 and 20.

FIGS. 17 through 20 are plan views illustrating various methods for connecting a control board to a printed circuit board, according to embodiments. As shown in FIGS. 17 through 20, the display devices according to the embodiments of the invention include a control board 30 mounting a timing controller 32 and a power IC 34.

The timing controller 32 receives digital video data of an input image and timing signals from an external host system and transmits the digital video data to the source driver ICs 15. The timing controller 32 generates source timing control signals for controlling operation timings of the source driver ICs 15 and gate timing control signals for controlling operation timings of the gate driver ICs 19 using the timing signals received from the host system. The gate timing control signals include a gate start pulse GSP, a gate output enable signal GOE, a gate shift clock GSC, etc.

The host system may be implemented as one of a television system, a home theater system, a set-top box, a navigation system, a DVD player, a Blu-ray player, a personal computer (PC), and a phone system. The host system scales the digital video data of the input image based on a resolution of the display panel. The host system transmits the digital video data of the input image and the timing signals to the timing controller 32.

The power IC 34 receives a DC input voltage using a power source circuit, such as a DC-DC convertor and a regulator, and generates electric powers required to drive the display panel. The power IC 34 outputs the gate high voltage VGH, the gate low voltage VGL, a gamma compensation voltage, the pixel power voltage ELVDD, etc.

Figure 17:
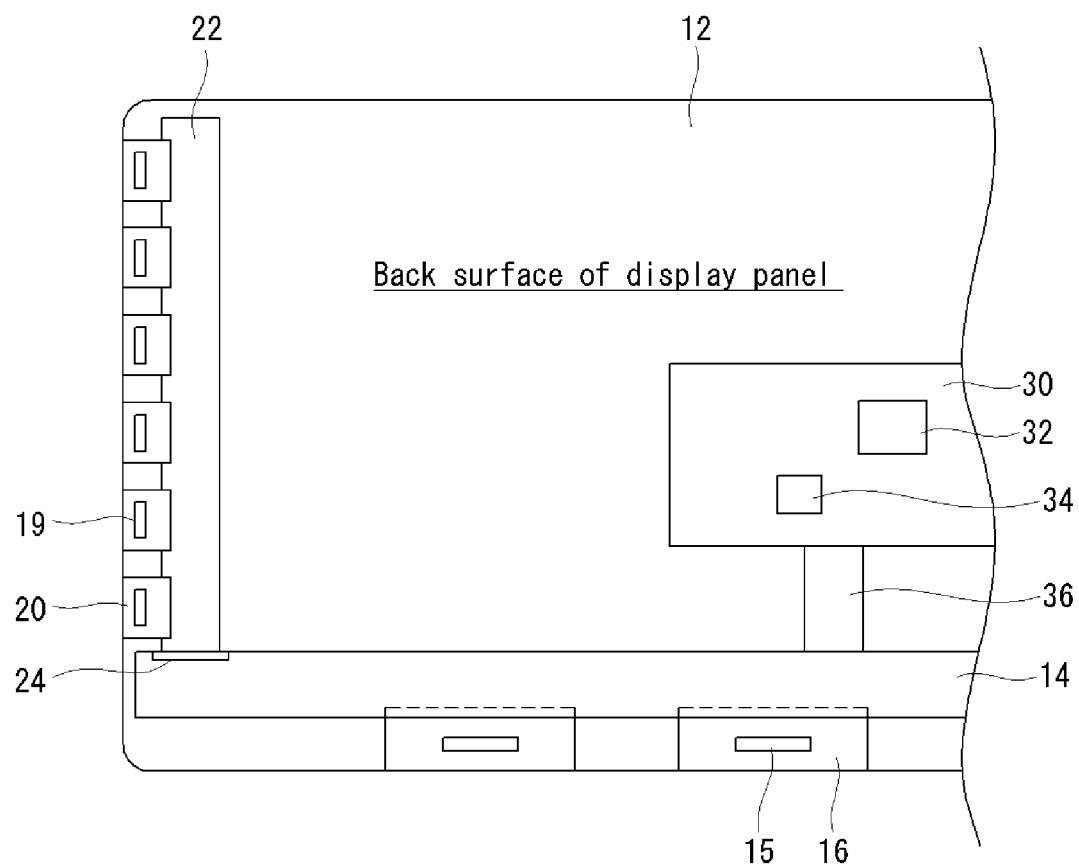
FIGS. 17 through 20 are plan views illustrating connecting a control board to a printed circuit board, according to embodiments.
Figure 18:
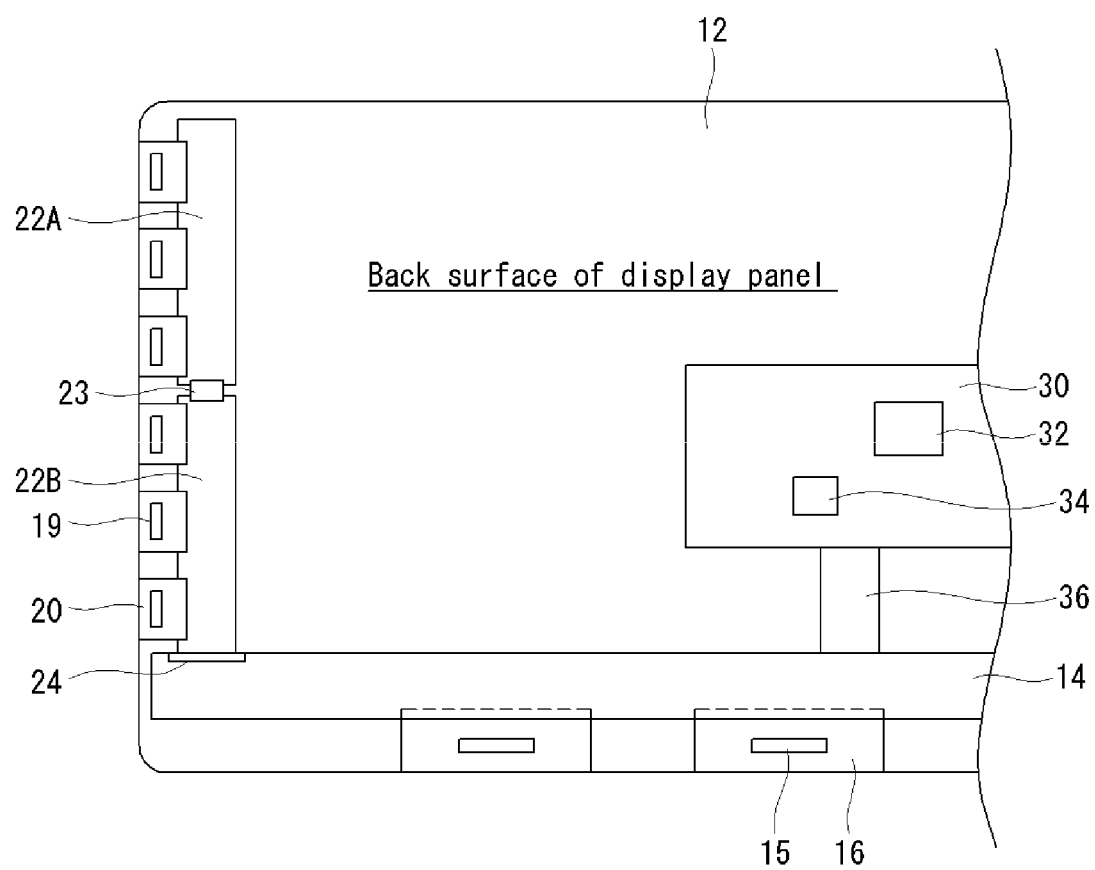

As shown in FIGS. 17 and 18, the control board 30 may be connected to the source PCB 14 through a flexible flat cable (FFC) 36 and a connector. The digital video data of the input image, the source timing control signals, and the gamma compensation voltage output from the control board 30 are transmitted to the source COFs 16 through the FFC 36 and the source PCB 14. The gate timing control signals, the gate high voltage VGH, the gate low voltage VGL, and the pixel power voltage ELVDD output from the control board 30 are transmitted to the gate COFs 20 through the FFC 36, the source PCB 14, and the gate PCB 22. As shown in FIG. 18, the gate PCB 22 may be divided into at least two PCBs 22A and 22B, and the PCBs 22A and 22B may be connected to each other through a FFC 23.

Figure 19:
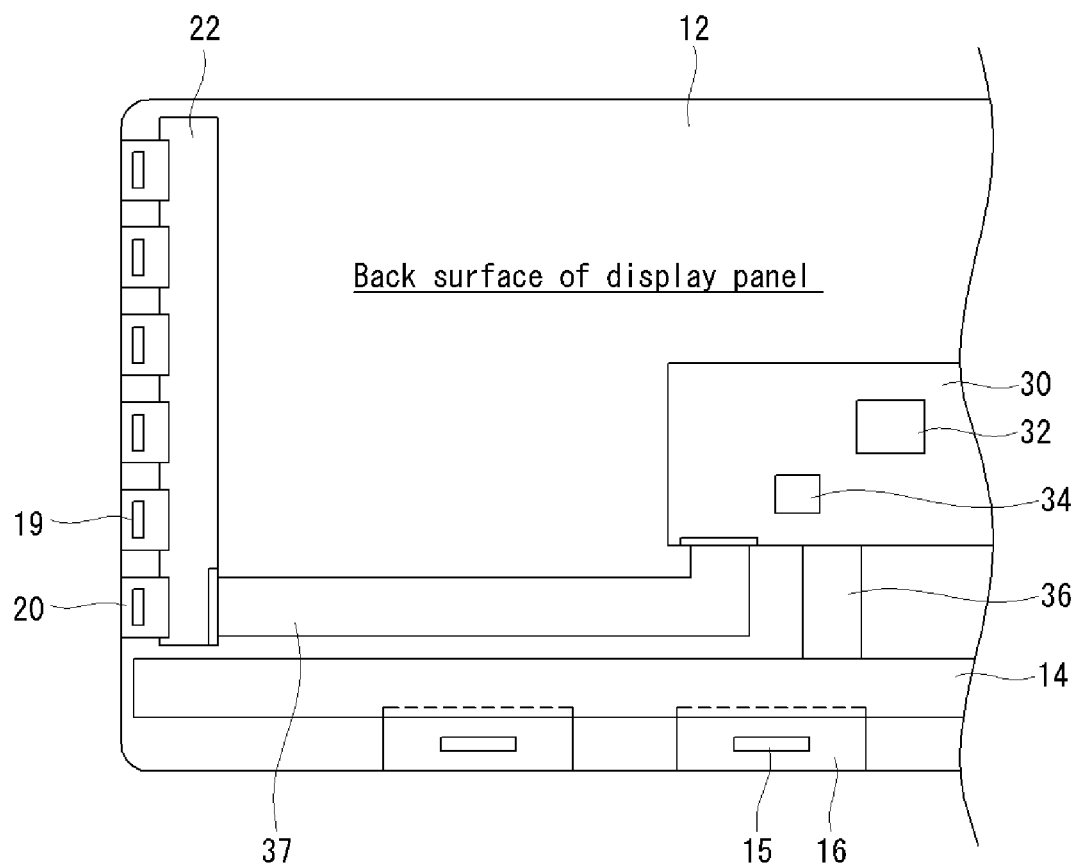

The gate COFs 20 may directly receive the signals required to drive the gate driver ICs 19 from the control board 30 without passing via the source PCB 14. For this, as shown in FIG. 19, the gate PCB 22 may be directly connected to the control board 30 through a FFC 37.

Figure 20:
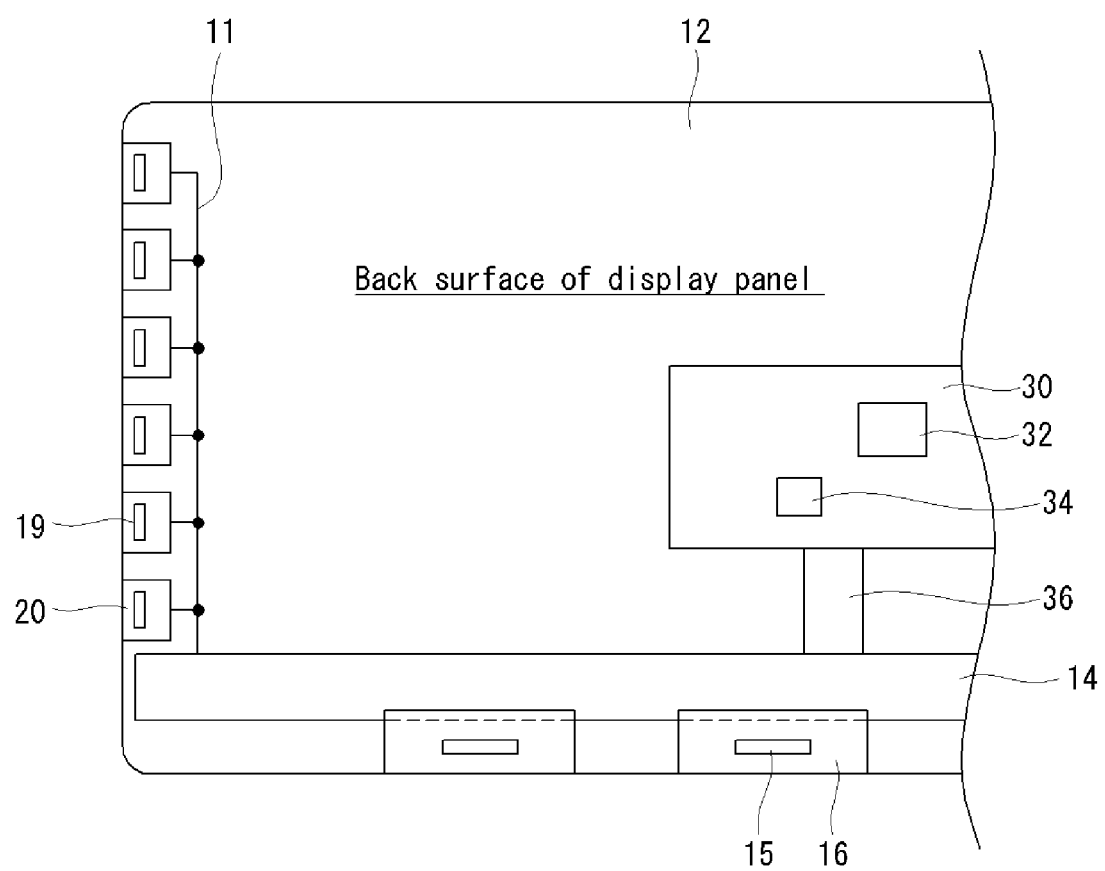

The gate COFs 20 may receive the signals required to drive the gate driver ICs 19 through the LOG lines 11 formed on the substrate 12 of the display panel. For this, as shown in FIG. 20, the LOG lines 11 are connected to the source PCB 14. The gate timing control signals, the gate high voltage VGH, the gate low voltage VGL, and the pixel power voltage ELVDD output from the control board 30 are transmitted to the gate COFs 20 through the FFC 36, the source PCB 14, and the LOG lines 11.

Figure 21:
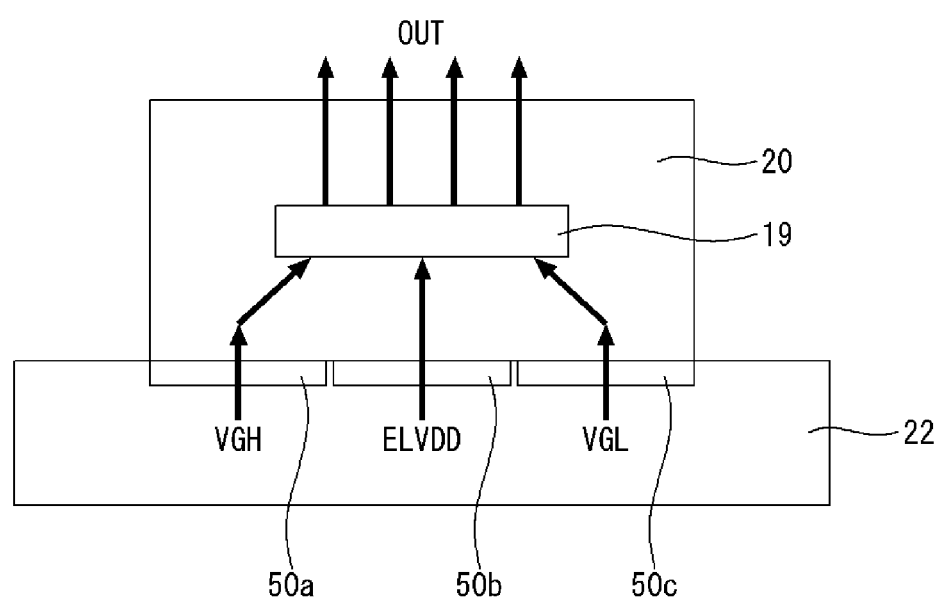
FIG. 21 is a plan view illustrating supplying an input signal of a gate COF, according to an embodiment.

FIG. 21 is a plan view illustrating a method for supplying an input signal of the gate COF 20, according to one embodiment. As shown in FIG. 21, the input terminal of the gate COF 20 includes a first power input terminal 50a to which the gate high voltage VGH is applied, a second power input terminal 50b to which the gate low voltage VGL is applied, and a third power input terminal 50c to which the pixel power voltage ELVDD is applied. In FIG. 21, input terminals, to which the gate timing control signals are applied, are omitted.

Figure 22:
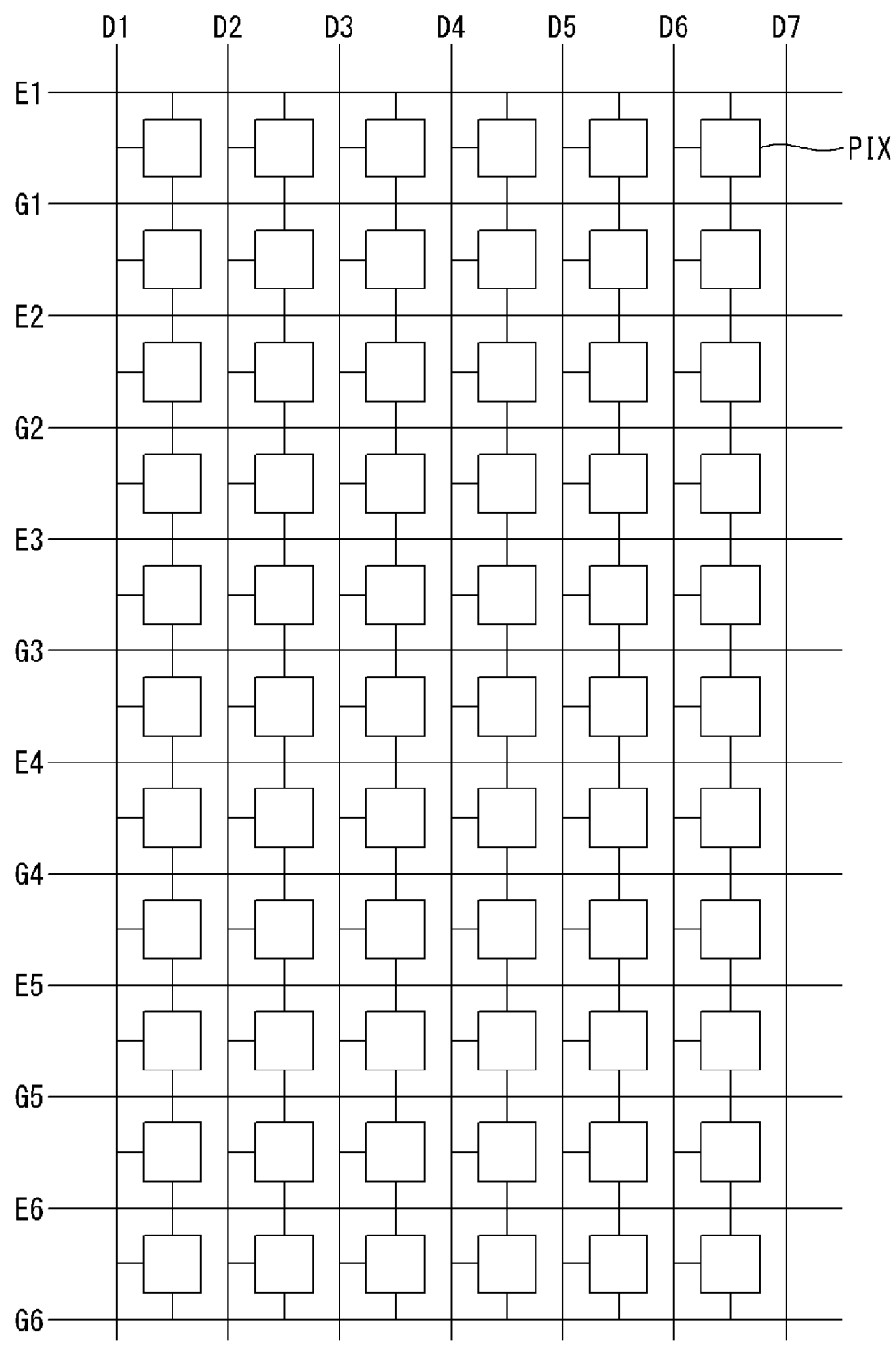
FIG. 22 illustrates a portion of a pixel array, according to an embodiment.

The number of the input signals to the gate COF 20 is much fewer than that of the source COF 16. Thus, the input terminals 50a, 50b, and 50c of the gate COF 20 may be manufactured to be larger than those of the source COF 16. The pixel power voltage ELVDD bypasses the gate driver ICs 19 and is supplied to pixel power lines E1 through E6 shown in FIG. 22. The pixel power lines E1 to E6 are formed on the substrate 12 of the display panel in a direction parallel to the scan lines G1 through G6. In FIG. 22, reference numerals D1 through D6 denote the data lines intersection with the pixel power lines E1 through E6 and the scan lines G1 through G6.

Figure 23:
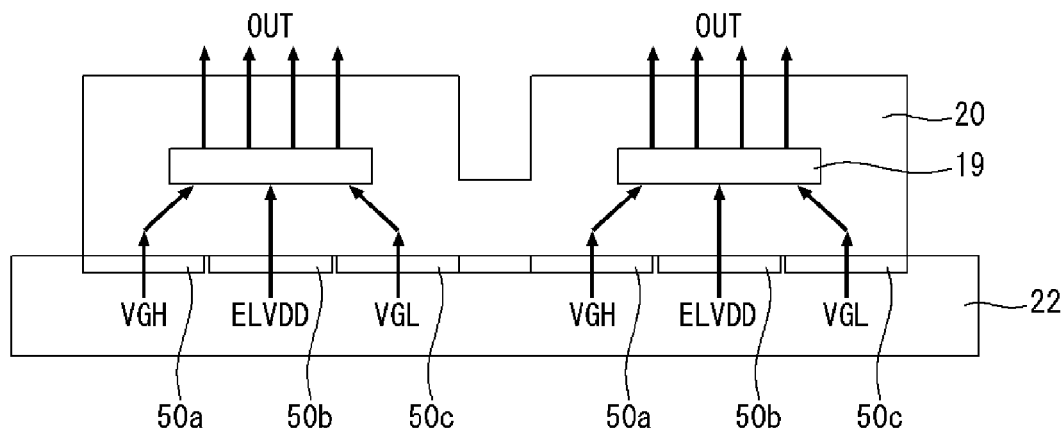
FIGS. 23 and 24 illustrate other examples of supplying an input signal of a gate COF, according to embodiments.
Figure 24:
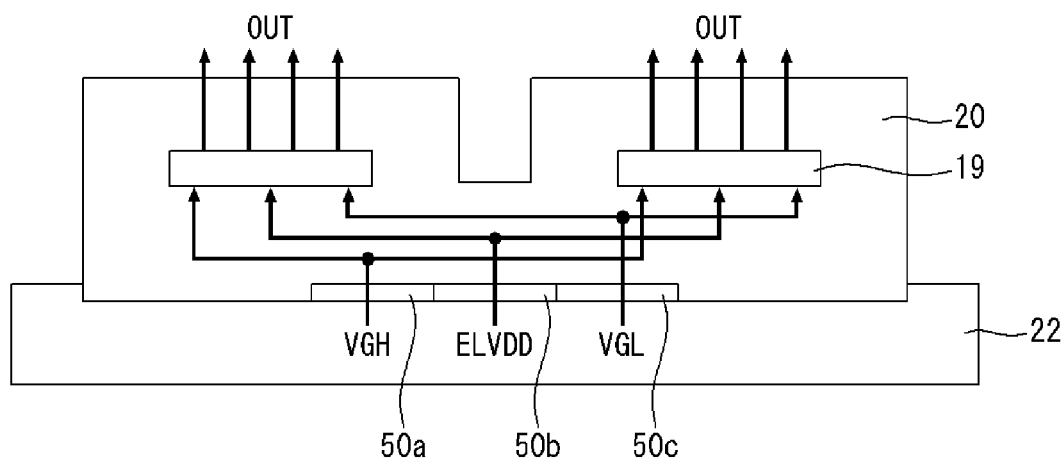

FIGS. 23 and 24 illustrate supplying an input signal of the gate COF according to other embodiments. When the plurality of driver ICs 15 (or 19) are mounted on one COF 16 (or 20) as shown in FIGS. 15 and 16, the electric powers VGH, VGL, and ELVDD may be supplied in series to each of the plurality of driver ICs as shown in FIG. 23. Alternatively, as shown in FIG. 24, the plurality of driver ICs 15 (or 19) may commonly use the power input terminals 50a, 50b, and 50c formed on one COF 16 (or 20), and the electric powers VGH, VGL, and ELVDD may be supplied in parallel to the plurality of driver ICs 15 (or 19).

Figure 25:
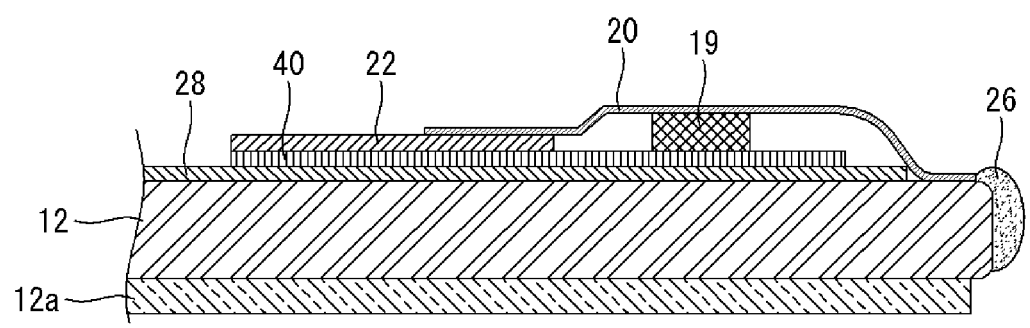
FIGS. 25 and 26 are cross-sectional views illustrating an example of mounting driver ICs on one surface of a COF and forming input and output terminals on the one surface of the COF, according to an embodiment.
Figure 26:
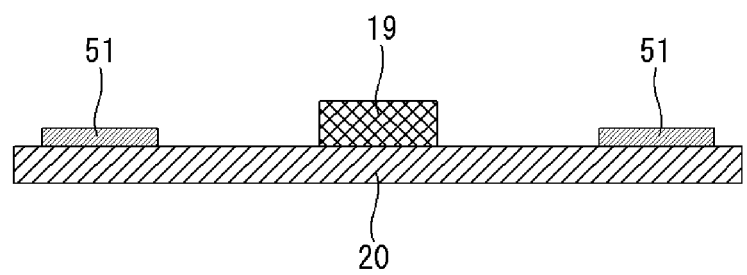
Figure 27:
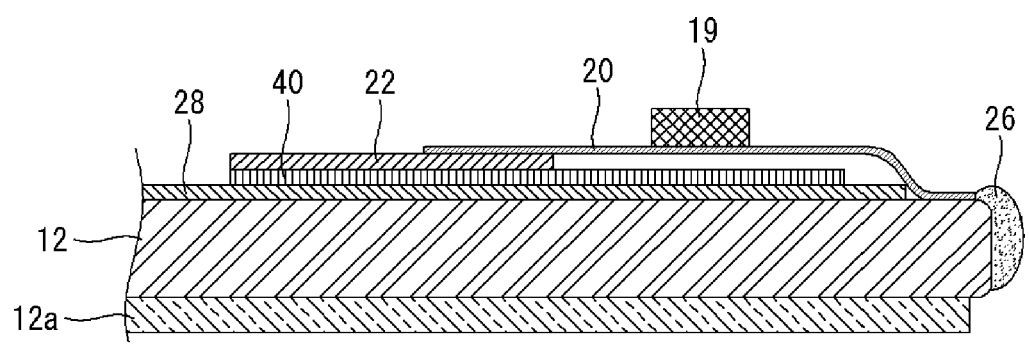
FIGS. 27 and 28 are cross-sectional views illustrating an example of mounting driver ICs on one surface of a COF and forming input and output terminals on the other surface of the COF, according to an embodiment.
Figure 28:
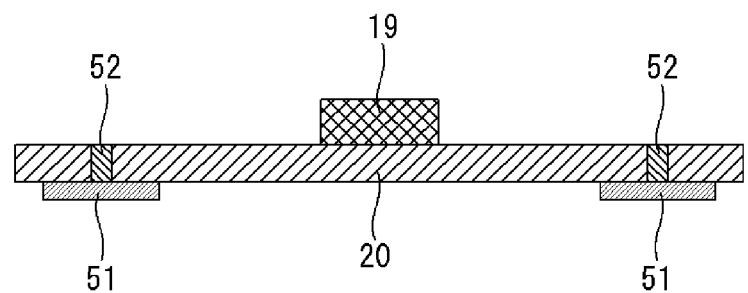

FIGS. 25 and 26 are cross-sectional views illustrating mounting the driver ICs 15 (or 19) on one surface of the COF 16 (or 20) and forming input and output terminals on the one surface of the COF 16 (or 20), according to an embodiment. FIGS. 27 and 28 are cross-sectional views illustrating an example of mounting the driver ICs 15 (or 19) on one surface of the COF 16 (or 20) and forming input and output terminals on the other surface of the COF 16 (or 20).

As shown in FIGS. 25 and 27, when the encapsulation member 28 is manufactured using metal, the PCBs 14 and 22 and the COFs 16 and 20 need to be clearly insulated from the encapsulation member 28 using a separate insulating material 40. The insulating material 40 may be an insulating tape having at least one surface applied with an adhesive. In the embodiment of the invention, the driver IC 15 (or 19) is positioned close to the substrate 12 of the display panel toward the substrate 12. Thus, the driver IC 15 (or 19) may directly contact and may interfere with the substrate 12 of the display panel or the encapsulation member 28. The insulating material 40 is positioned between the driver IC 15 (or 19) and the substrate 12 of the display panel or between the driver IC 15 (or 19) and the encapsulation member 28 to prevent the direct contact and the interference between them.

As shown in FIG. 26, when input and output terminals 51 the driver IC 15 (or 19) is mounted on the same surface of the COF 16 (or 20), the COF 16 (or 20) is bonded to the substrate 12 in the reverse direction in the shape shown in FIG. 25.

Alternatively, as shown in FIG. 28, input and output terminals 51 may be formed on one surface of the COF 16 (or 20), and the driver IC 15 (or 19) may be mounted on the opposite surface of the COF 16 (or 20). Lines connected to input and output terminals of the driver IC 15 (or 19) may be connected to the input and output terminals 51 of the opposite surface through via holes 52, each of which is filled with a conductive filler. The COF 16 (or 20) having the structure shown in FIG. 28 is bonded to the substrate 12 in the reverse direction in the same shape as FIG. 27. When the COF 16 (or 20) is bonded to the substrate 12 as shown in FIG. 28, the COF 16 (or 20) may be bonded to the substrate 12 in a more flat manner. Hence, thinner profile of the organic light emitting display may be achieved.

Figure 29:
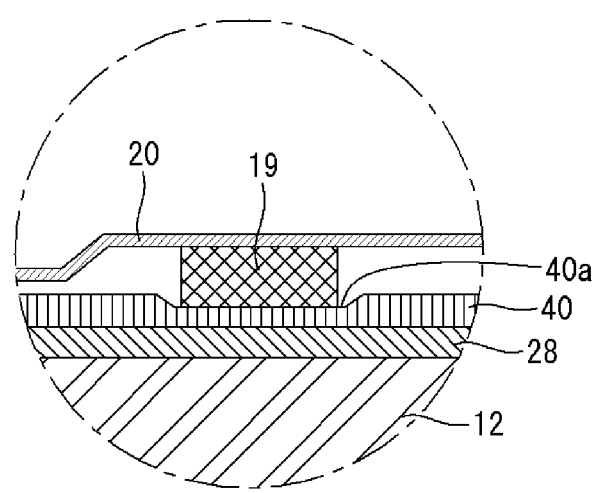
FIG. 29 is a cross-sectional view illustrating an example of forming a groove of an insulating material shown in FIGS. 25 and 26 for receiving a driver IC, according to an embodiment.

FIG. 29 is a cross-sectional view illustrating an example of forming a groove of the insulating material 40, in which the driver IC 15 (or 19) is received. As shown in FIG. 29, the insulating material 40 is positioned between the driver IC 15 (or 19) and the substrate 12 of the display panel. The insulating material 40 has a groove 40a in a portion opposite the driver IC 15 (or 19). The driver IC 15 (or 19) is received in the groove 40a of the insulating material 40 and thus may be fixed onto the insulating material 40.

Figure 30A:
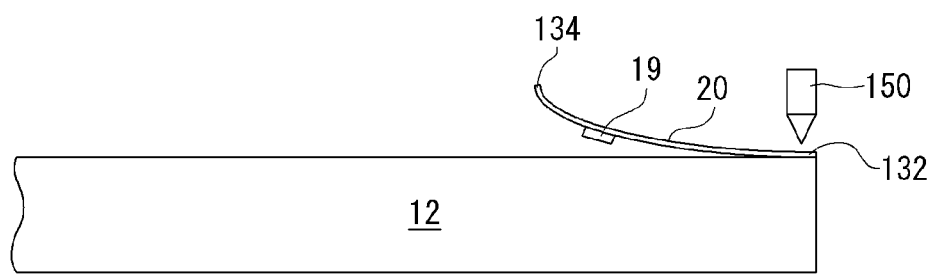
FIG. 30A is a schematic diagram illustrating bonding of an end of COF to a substrate of a display panel, according to one embodiment.

FIG. 30A is a schematic diagram illustrating bonding of an end 132 of COF 20 to a substrate 12 of a display panel, according to one embodiment. In order to obviate bending or flipping over of the COF 20 after assembly, the COF 20 is laid relatively flat and aligned on the substrate 12. Then a bonding tool 150 heats and bonds a first end 132 of the COF 20 to the substrate 12 with an anisotropic conductive film (ACF).

Figure 30B:
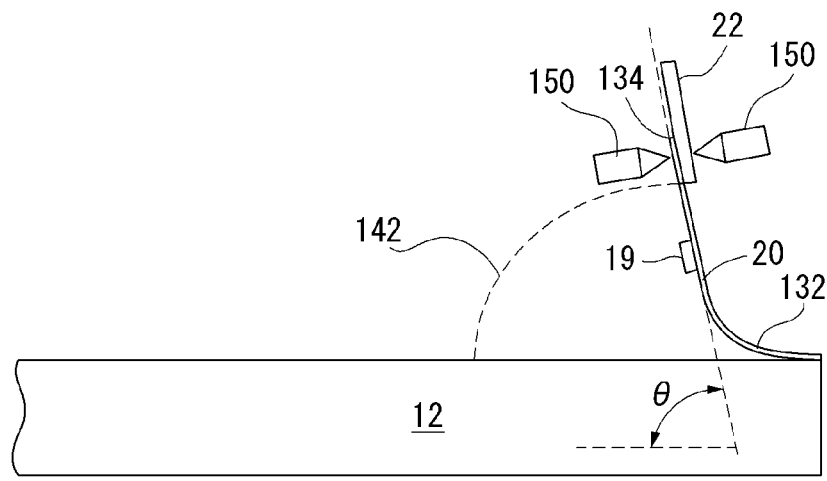
FIG. 30B is a schematic diagram illustrating bonding of another end of COF to a gate PCB with the other end of COF raised from the substrate of the display panel, according to one embodiment.

FIG. 30B is a schematic diagram illustrating bonding of a second end 134 of COF to the gate PCB 22 with the second end 134 of COF raised from the substrate 12 of the display panel, according to one embodiment. After bonding the first end 132 of COF 20 to the substrate 12, the second end 134 is lifted up from the substrate 12 using various methods (e.g., vacuum suction tube) and moved to a predetermined location via a predetermined path 142. Then the second end 134 of the COF 20 is aligned with the gate PCB 22.

When the second end 134 is placed at the predetermined location, the second end 134 and the nearby portions of the substrate form an angle θ with respect to the top surface of the substrate 12. The angle θ may take a value larger than zero to 180 degrees. For example, the angle θ is 90 degrees (i.e., the second end 134 of COF 20 is placed in an upright position). It is preferable to set the angle θ so that the second end 134 is located away from the substrate 12 by a certain distance. In this way, the heat from the bonding tool 150 does not negatively affect the substrate 12 and also sufficient space is provided for any mechanical structure associated with the bonding tool 150 to operate without interfering with the substrate 12. The bonding tool 150 then applies heat and pressure to the COF 20 and bond the COF 20 to the gate PCB 22 with the ACF.

Figure 30C:
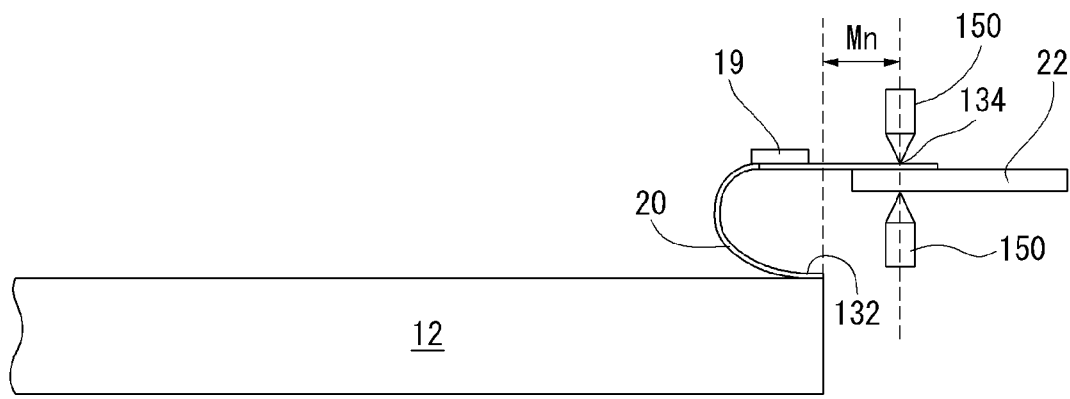
FIG. 30C is a schematic diagram illustrating bonding of the other end of COF to the gate PCB with the COF flipped over away from the display panel, according to one embodiment.

FIG. 30C is a schematic diagram illustrating bonding of the second end 134 of COF to the gate PCB 22 with the COF 20 flipped over away from the substrate 12 of the display panel, according to one embodiment. The embodiment of FIG. 30C is the case where the angle θ is 180 degrees, and the second end 134 is located away from the edge of the substrate 12 by a distance of Mn. The distance Mn may be set sufficiently large so that the heat from the bonding tool 150 does not negatively affect the substrate 12 and also provide sufficient space for any mechanical structure associated with the bonding tool 150 to operate without interfering with the substrate 12. After the COF 20 is bonded to the gate PCB 22, the COF 20 is again flattened to rest on the substrate 12 with the gate PCB 22 attached to the COF 20.

Although FIGS. 30A through 30C illustrate the COF 20 bonded to the gate PCB 22, the COF 16 can also be bonded to the substrate 12 and the source PCB 14 using a similar method. That is, the COF 16 may be bonded to the substrate 12 first at one end, and then the other end may be lifted and rotated for an angle to a predetermined location for bonding to the source PCB 14. By bonding the COF 16, 20 to the substrate and the PCBs described above with reference to FIGS. 30A through 30C, the COF 16, 20 is not bent after assembly to extend beyond the edges of the substrate 12, and hence, the bezel portion of the display device can be made thinner or obviated entirely.

Figure 31:
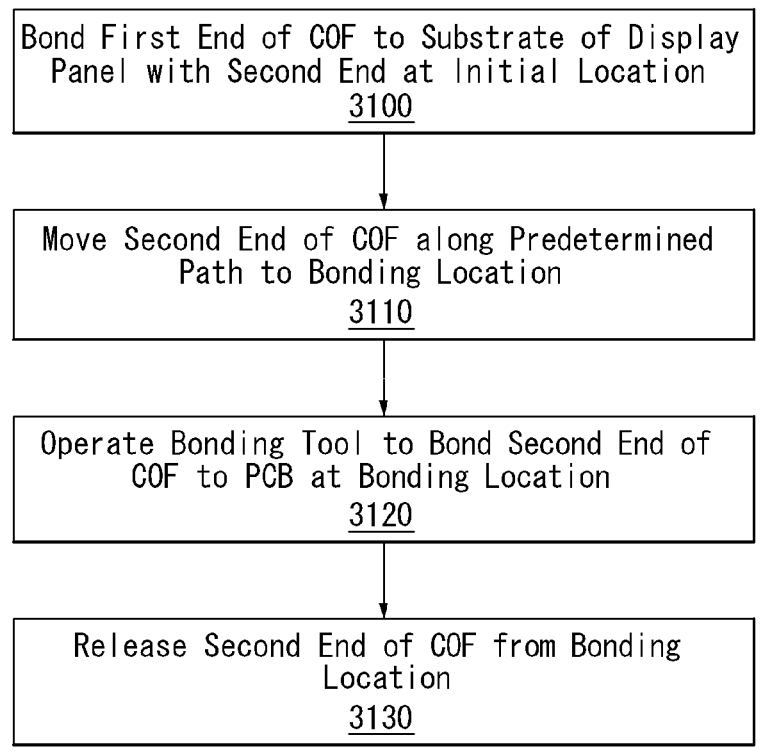
FIG. 31 is a flowchart illustrating a method of bonding the COF to the substrate of the display panel and then to a PCB, according to one embodiment.

FIG. 31 is a flowchart illustrating a method of bonding the COF 16, 22 to the substrate 12 of the display panel and then bonding the COF 16, 22 to a PCB, according to one embodiment. The first end 132 of the COF 16, 22 is bonded to the substrate 12 of a display pane, as described above with reference to FIG. 30A, in the step 3100. At this time, the second end 134 of the COF 16, 22 is placed at an initial location on or above the substrate 12.

After bonding the COF 16, 22 to the PCB, the second end 134 of the COF 16, 22 is lifted and moved along a predetermined path to a bonding location where the COF 16, 22 is bonded to the PCB in the steps 3110 and 3120. The predetermined path may be set so that no fracturing or damage occurs in the COF 16, 22 during the movement of the second end 134.

The bonding tool 150 is then operated the step 3120 to bond the second end 134 of the COF 16, 22 to the PCB at bonding location, as described above with reference to FIG. 30B or FIG. 30C. After the second end 134 is bonded to the PCB, the second end 134 of the COF 16, 22 is released from bonding location in the step 3130.

Figure 32A:
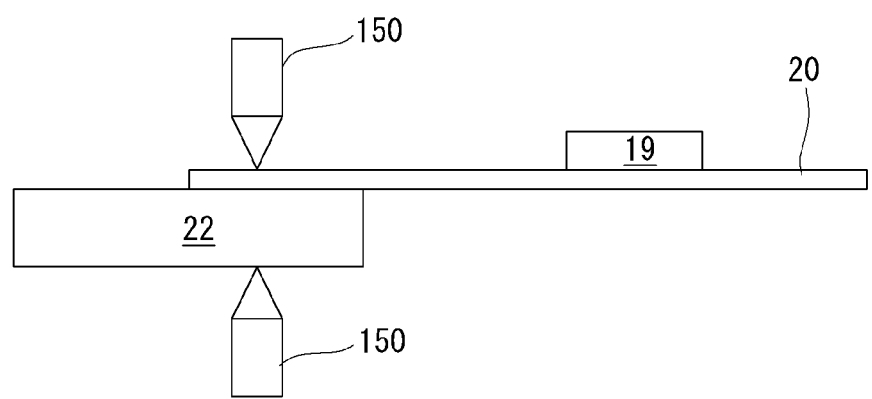
FIG. 32A is a schematic diagram illustrating bonding a COF to a gate PCB before bonding the COF to the substrate of the display panel, according to one embodiment.

FIG. 32A is a schematic diagram illustrating bonding the COF 20 to the gate PCB 22 before bonding the COF 20 to the substrate 12 of the display panel, according to one embodiment. In contrast to the embodiments described above with reference to FIGS. 30A through 30C, the COF 20 is first bonded to the PCB 22 and then bonded to the substrate 12. As illustrated in FIG. 32A, one end of the COF 20 is first bonded by the bonding tool 150 to the COF 20 (mounted with a gate driver IC 19) by heating the bonding tool 150 and applying pressure to the COF 20 and the PCB 22.

Figure 32B:
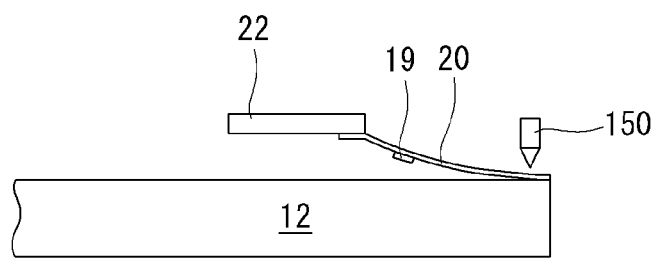
FIG. 32B is a schematic diagram illustrating bonding the COF to the substrate of the display panel with the PCB attached to the COF, according to one embodiment.

FIG. 32B is a schematic diagram illustrating bonding the COF 20 to the substrate 12 of the display panel with the PCB 22 attached to the COF 20, according to one embodiment. After bonding the PCB 22 to the COF 20, the other end of the COF 20 is placed on the substrate 12 and bonded to the substrate 12 by heating and exerting pressure by the bonding tool 150. While the COF 20 is being bonded to the substrate 12, the PCB 22 may be placed on or over the substrate 12. The embodiment of FIGS. 32A and 32B is advantageous, among other reasons, because the COF 20 does not need to be bent to any significant angle during the assembly process.

Figure 33:
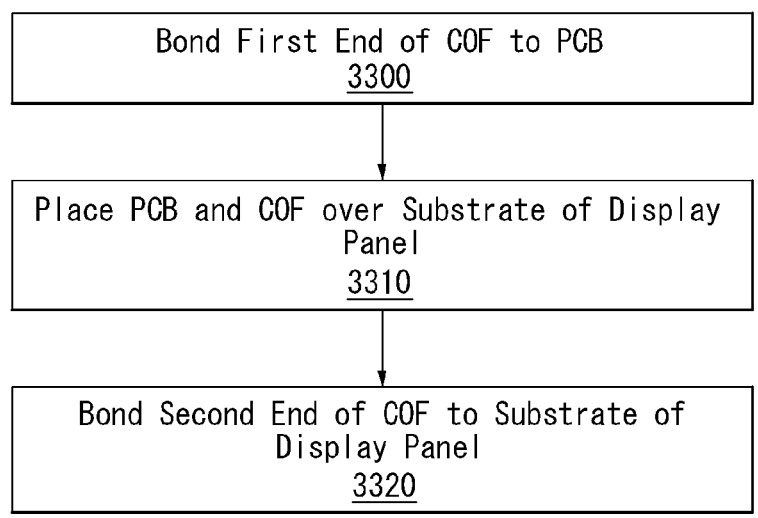
FIG. 33 is a flowchart illustrating a method of bonding the COF to the PCB and then to the substrate of the display panel, according to one embodiment.

FIG. 33 is a flowchart illustrating a method of bonding the COF 20 to the PCB 22 and then to the substrate 12 of the display panel, according to one embodiment. First, a first end of the COF 20 is bonded to the PCB 22, as described above with reference to FIG. 32A, in the step 3300. The PCB 22 and the COF 20 is then placed over the substrate 12 of the display panel in the step 3310. Then the second end of the COF 20 is bonded to substrate 12 of the display panel, as described above with reference to FIG. 32B in the step 3320.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a substrate comprising a pixel array;
    a flexible circuit on which a driver integrated circuit (IC) is mounted,
    an encapsulation member bonded to a back surface of the substrate, and
    an insulating layer separate from the encapsulation member, the insulating layer between the encapsulation member and the driver IC; and
    a printed circuit board bonded to a first end of the flexible circuit to supply signals to lines formed in the pixel array;
    wherein a second end of the flexible circuit is bonded to the substrate without protruding beyond an edge of the substrate, and an entire surface of the flexible circuit faces the substrate without flipping of the flexible circuit.

2. The display device of claim 1, wherein the substrate further comprises data pads connected to data lines of the pixel array, and scan pads connected to scan lines of the pixel array,
    wherein the flexible circuit comprises at least one of a source flexible circuit connecting a source driver IC to the data pads, and a scan flexible circuit connecting a scan driver IC to the scan pads.

3. The display device of claim 1, wherein the first end of the flexible circuit faces toward an inside of the substrate when the flexible circuit is placed on or over the substrate,
    wherein the one end of the flexible circuit is separated from the edge of the substrate by a distance equal to or greater than 0.3 mm.

4. The display device of claim 1, wherein the flexible circuit is one of a chip-on film (COF) and a tape carrier package (TCP).

5. The display device of claim 2, wherein a plurality of driver ICs are mounted on the flexible circuit.

6. The display device of claim 2, further comprising:
    line-on glass (LOG) lines directly formed on the substrate and connected to the flexible circuit; and
    a source printed circuit board connected to the LOG lines.

7. The display device of claim 2, further comprising:
    a control board configured to output digital video data of an input image, a source timing control signal for controlling operation timing of the source driver IC, a gate timing control signal for controlling operation timing of the gate driver IC, a gate high voltage and a gate low voltage of the scan signal, a pixel power voltage applied to pixels of the pixel array, and the control board connected to a printed circuit board through a flexible flat cable.

8. The display device of claim 7, wherein a plurality of gate driver ICs are mounted on the flexible circuit, and wherein the gate high voltage, the gate low voltage, and the pixel power voltage are supplied in series or in parallel to each of the plurality of gate driver ICs through input terminals formed on the flexible circuit.

9. The display device of claim 1, wherein the insulating layer is formed with a groove for receiving the driver IC.

10. The display device of claim 1, wherein the encapsulation member is made of an electrically conductive material.

11. A display device comprising:
    a substrate comprising a pixel array,
    a flexible circuit on which a driver integrated circuit (IC) is mounted,
    an encapsulation member bonded to a back surface of the substrate, and
    an insulating layer separate from the encapsulation member, the insulating layer physically in contact with the encapsulation layer; and
    a printed circuit board bonded to a first end of the flexible circuit to supply signals to lines formed in the pixel array;
    wherein a second end of the flexible circuit is bonded to the substrate without protruding beyond an edge of the substrate, and an entire surface of the flexible circuit faces the substrate without flipping of the flexible circuit.

12. The display device of claim 11, wherein the substrate further comprises data pads connected to data lines of the pixel array, and scan pads connected to scan lines of the pixel array,
    wherein the flexible circuit comprises at least one of a source flexible circuit connecting a source driver IC to the data pads, and a scan flexible circuit connecting a scan driver IC to the scan pads.

13. The display device of claim 11, wherein the first end of the flexible circuit faces toward an inside of the substrate when the flexible circuit is placed on or over the substrate,
    wherein the one end of the flexible circuit is separated from the edge of the substrate by a distance equal to or greater than 0.3 mm.

14. The display device of claim 11, wherein the flexible circuit is one of a chip-on film (COF) and a tape carrier package (TCP).

15. The display device of claim 12, wherein a plurality of driver ICs are mounted on the flexible circuit.

16. The display device of claim 12, further comprising:
    line-on glass (LOG) lines directly formed on the substrate and connected to the flexible circuit; and
    a source printed circuit board connected to the LOG lines.

17. The display device of claim 12, further comprising:
    a control board configured to output digital video data of an input image, a source timing control signal for controlling operation timing of the source driver IC, a gate timing control signal for controlling operation timing of the gate driver IC, a gate high voltage and a gate low voltage of the scan signal, pixel power voltage applied to pixels of the pixel array, and the control board connected to a printed circuit board through a flexible flat cable.

18. The display device of claim 17, wherein a plurality of gate driver ICs are mounted on the flexible circuit, and wherein the gate high voltage, the gate low voltage, and the pixel power voltage are supplied in series or in parallel to each of the plurality of gate driver ICs through input terminals formed on the flexible circuit.

19. The display device of claim 11, wherein the insulating layer is formed with a groove for receiving the driver IC.

20. The display device of claim 11, wherein the encapsulation member is made of an electrically conductive material.

* * * * *